US006686125B2

(12) United States Patent
Hoshi et al.

(10) Patent No.: US 6,686,125 B2
(45) Date of Patent: Feb. 3, 2004

(54) LITHOGRAPHIC PRINTING PLATE PRECURSOR

(75) Inventors: Satoshi Hoshi, Shizuoka (JP); Shingo Ishimaru, Kanagawa (JP); Keizo Ogawa, Kanagawa (JP); Kouichi Waki, Kanagawa (JP); Kiyotaka Fukino, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 271 days.

(21) Appl. No.: 09/756,920

(22) Filed: Jan. 10, 2001

(65) Prior Publication Data

US 2001/0036592 A1 Nov. 1, 2001

(30) Foreign Application Priority Data

Jan. 14, 2000 (JP) .................................... P.2000-006968
Jan. 25, 2000 (JP) .................................... P.2000-016040
May 15, 2000 (JP) .................................... P.2000-141482

(51) Int. Cl.[7] .................................................. G03F 7/09

(52) U.S. Cl. ............................... 430/271.1; 430/273.1; 430/138; 101/453

(58) Field of Search .......................... 430/270.1, 271.1, 430/273.1, 302, 303, 348, 944, 945, 964, 138; 101/453, 463.1, 465, 466, 467

(56) References Cited

U.S. PATENT DOCUMENTS

| | | | | | |
|---|---|---|---|---|---|
| 4,863,845 | A | * | 9/1989 | Murai et al. | 430/569 |
| 5,950,542 | A | * | 9/1999 | Harris et al. | 101/457 |
| 6,014,930 | A | | 1/2000 | Burberry et al. | 101/456 |
| 6,022,668 | A | * | 2/2000 | Burberry et al. | 430/302 |
| 6,132,934 | A | * | 10/2000 | Vermeersch et al. | 430/273.1 |
| 6,136,425 | A | * | 10/2000 | Akiyama et al. | 428/314.2 |
| 6,153,353 | A | * | 11/2000 | Van Damme et al. | 430/270.1 |
| 6,399,270 | B1 | * | 6/2002 | Mori et al. | 430/270.1 |
| 6,420,091 | B1 | * | 7/2002 | Nakayama et al. | 430/302 |
| 6,455,222 | B1 | * | 9/2002 | Fukino et al. | 430/270.1 |
| 6,465,146 | B1 | * | 10/2002 | Kawamura | 430/138 |
| 2001/0033992 | A1 | * | 10/2001 | Kita | 430/273.1 |

FOREIGN PATENT DOCUMENTS

| | | | | | |
|---|---|---|---|---|---|
| EP | 0925916 | | | 6/1999 | |
| EP | 0976549 | | | 2/2000 | |
| JP | 2001-105761 | A | * | 4/2001 | B41N/1/14 |
| WO | WO99/04974 | | | 4/1999 | |

OTHER PUBLICATIONS

Research Disclosure 32075 (1990).

Research Disclosure 33303 (1992).

* cited by examiner

*Primary Examiner*—Rosemary Ashton
*Assistant Examiner*—Barbara Gilliam
(74) *Attorney, Agent, or Firm*—Burns, Doane, Swecker & Mathis, LLP

(57) ABSTRACT

A lithographic printing plate precursor which comprises a support having provided thereon a layer containing a light-to-heat converting agent as a lower layer and a hydrophilic photosensitive layer containing light-to-heat convertible metallic fine particles which change to hydrophobic with the conversion of light to heat as an upper layer.

15 Claims, 2 Drawing Sheets

LITHOGRAPHIC PRINTING PLATE PRECURSOR

FIELD OF THE INVENTION

The present invention relates to a lithographic printing plate precursor which requires no development and is excellent in press life. More specifically, the present invention relates to a lithographic printing plate precursor capable of plate-making by heat mode image-recording, also capable of image-recording by scanning exposure based on digital signals, and capable of mounting on a printing machine for plate-making and printing with requiring no development.

BACKGROUND OF THE INVENTION

A lithographic printing plate generally comprises a lipophilic image area which receives an ink and a hydrophilic non-image area which receives fountain solution during printing. As such a lithographic printing plate precursor, a PS plate (presensitized plate) comprising a hydrophilic support having provided thereon a lipophilic photosensitive resin layer has so far been widely used.

On the other hand, digitized techniques of electronically processing, accumulating and outputting image data by using a computer have prevailed, and various image output systems corresponding to these digitized techniques have been put to practical use. As one example of such techniques, a computer-to-plate technique directly making a printing plate is attracting public attention, which comprises a step of scanning exposing a printing plate precursor with high convergent radiant rays such as laser beams carrying digitized image data without using a lith film. With such a tendency, it has become an important technical subject to obtain the printing plate precursor well adapted to this purpose.

Solid state lasers having high output, e.g., a semiconductor laser and a YAG laser are inexpensively available in recent years. As a result, as a producing method of a printing plate by scanning exposure which is easy to be incorporated in a digitized technique, a plate-making method using these lasers as an image-recording means is promising.

In conventional plate-making methods, image-recording is performed by imagewise exposing a photosensitive printing plate precursor in low to middle intensity to cause the change of imagewise physical properties on the surface of the precursor by a photochemical reaction. On the other hand, in a method of using the exposure of high power density by a high output laser, a large quantity of light energy is irradiated on an exposure region convergently during a momentary exposure time, the light energy is efficiently converted to heat energy to cause a chemical change, a phase change, or a thermal change such as the change of form and structure due to the heat, and that change is utilized in image-recording. That is, image data are inputted by light energy such as laser beams, but image-recording is performed by the reaction due to heat energy. This recording system making use of heat generation by high power density exposure is generally called heat mode recording and converting light energy to heat energy is called light-to-heat conversion.

A big advantage of a plate-making method utilizing a heat mode recording means is that a material is not sensitive to light of general intensity level, such as room illumination, and the image recorded by high intensity exposure does not necessitate fixation. That is, when a heat mode material is used in image-recording, the material is safe to room light before exposure and fixation of the image after exposure is not essential.

Accordingly, if heat mode recording is utilized, it is expected that it will be possible to obtain a lithographic printing plate precursor which is easily developed to a computer-to-plate system.

As one preferred plate-making method of lithographic printing plate on the basis of heat mode recording, a method has been suggested which comprises the steps of providing a hydrophobic image-recording layer on a hydrophilic substrate, imagewise exposing the hydrophobic layer by heat mode exposure to change the solubility and dispersibility of the hydrophobic layer, and, if necessary, removing the non-image area by wet development.

As an example of such a printing plate precursor, there is disclosed in JP-B-46-27919 (the term "JP-B" as used herein means an "examined Japanese patent publication") a method for obtaining a printing plate by heat mode recording a printing plate precursor comprising a hydrophilic support having provided thereon a recording layer showing a so-called positive function, i.e., a recording layer having a function whose solubility is improved by heat, specifically a recording layer having a specific composition such as saccharides and melamine-formaldehyde resins. Since the disclosed simple plate-making techniques of heat mode recording including the above method are in general not sufficient in heat sensitivity, the sensitivity is extremely insufficient for heat mode scanning exposure. Hence the discrimination of hydrophobicity/hydrophilicity of the irradiated area and the non-irradiated area, i.e., the discrimination of the image area and the non-image area, is small, which has been the restriction in practical use. If the discrimination is insufficient, plate-making according to the on-press development system is substantially difficult.

As the means to solve that problem, methods to remove the image layer at the irradiated area by heat splashing due to the work of heat by high output laser beam irradiation (called abrasion) are disclosed, e.g., in WO 98/40212, WO 98/34796 and JP-A-6-199064 (the term "JP-A" as used herein means an "unexamined published Japanese patent application"), specifically lithographic printing plate precursors capable of plate-making without performing development which comprises a substrate having thereon plural layers comprising a hydrophilic layer containing transition metallic oxide colloid as the upper layer and a lipophilic image-recording layer as the lower layer are disclosed. The discriminability of the irradiated area and the non-irradiated area where heat splashing has been completely performed is certainly large according to these methods, but there arise other problems that the printing machine (i.e., the printing press) is stained by the splashed matter, the stain on the printing plate surface impairs the operation of the printer and printing quality, in addition, the heat of the irradiated light often does not reach the deep part of the image-recording layer, as a result, the bottom part of the image-recording layer close to the support is not splashed and remains, i.e., the phenomenon called a residual film is brought about. Substantial discriminability cannot be exhibited due to the residual film, which leads to the reduction of printing quality.

As is the situation, as a method not accompanied by such drawbacks, there are disclosed simple plate-making methods making use of the change of the degree of hydrophilicity/hydrophobicity of the surface by heat, i.e., the change of polarity, not according to abrasion even when an image is formed by heat mode light irradiation. For example, methods comprising the steps of the addition of a thermoplastic polymer such as hydrophobic wax and polymer latex to a hydrophilic layer and hydrophobitization by phase separation to the surface by heat are disclosed in JP-B-44-22957, JP-A-58-199153 and U.S. Pat. No. 3,168,864. These techniques suggest a direction of the improving means of discriminability. However, since these disclosed techniques are insufficient in discriminability and there is apprehension about staining of printed matter due to, in particular, insufficient hydrophilicity, the improvement is desired.

Sufficient discrimination of an image area and a non-image area is a fundamental important characteristic directly linked with the improvement of printing quality, such as printing stain prevention and inking property, and press life, accordingly, the development of a plate-making method having high discriminating property and easiness of print-making operation, in particular, a plate-making method having high discriminating property and high sensitivity, requiring no development process, capable of heat mode plate-making, and excellent in press life and inking property at printing is desired.

Further, according to the study by the present inventors, in the case of image-forming by utilizing heat mode light irradiation, in particular, image formation by utilizing the change of polarity by irradiation of laser beams, a hydrophobic layer is not sufficiently formed if heat diffusion to a support is fast. If the irradiated light amount is increased to avoid the insufficient layer formation, there arises an undesirable problem that the printing machine and the printing plate are stained by heat splashing of the image layer. Therefore, it is desired to bring it into realization to improve discriminating property, to widen a degree of latitude in light irradiation, and at the same time to improve press life and inking property by making it possible to form an image with little energy.

SUMMARY OF THE INVENTION

An object of the present invention is to solve the above-described defects of the heat mode plate-making method and improve the performance of the heat mode plate-making method.

That is, an object of the present invention is to provide a heat mode type lithographic printing plate precursor requiring no development process, having high sensitivity and broad latitude in exposure amount, capable of easily plate-making, capable of directly mounting on a printing machine for plate-making, and preventing printing stain of the printing plate surface.

In particular, an object of the present invention is to provide a heat mode type lithographic printing plate precursor from which a plate-making can be easily carried by scanning system image exposure by laser beams, excellent in the discriminability of an image area and a non-image area, having broad latitude in image exposure amount, and having a press life of long duration and excellent in inking property at printing.

As a result of the investigation of the above problems, the present inventors have found that by the provision of a light-to-heat convertible exothermic layer as the lower layer of a hydrophilic photosensitive layer containing metallic fine particles as a light-to-heat converting agent, the discriminability of an image area and a non-image area can be improved, printing staining and press life can be improved, in addition to these, the exothermic amount per a light irradiation amount increases, thus it becomes possible to form an image with less exposure energy, and further, the sensitivity and the latitude can be improved. The present inventors have continued further investigations on the basis of the above knowledge, thus the present invention has been accomplished.

That is, the present invention has been achieved by the following means.

(1) A lithographic printing plate precursor which comprises a support having provided thereon a layer containing a light-to-heat converting agent as a lower layer and a hydrophilic photosensitive layer containing light-to-heat convertible metallic fine particles which change to hydrophobic with the conversion of light to heat as an upper layer.

(2) The lithographic printing plate precursor as described in the above item (1), wherein the metallic fine particles contained in a hydrophilic photosensitive layer are single or alloy metallic fine particles selected from the metallic elements belonging to group VIII or group I-B of the Periodic Table.

(3) The lithographic printing plate precursor as described in the above item (1) or (2), wherein an organic sulfur compound having at least one hydrophilic group and at least one metal-adsorbing group is adsorbed onto the surfaces of the metallic fine particles contained in a hydrophilic photosensitive layer.

(4) The lithographic printing plate precursor as described in the above item (1), (2) or (3), wherein a water-soluble protective layer is further provided on the hydrophilic photosensitive layer.

(5) The lithographic printing plate precursor as described in the above item (1), wherein said hydrophilic photosensitive layer further contains a hydrophobitization precursor having a hydrophilic surface.

(6) The lithographic printing plate precursor as described in the above item (5), wherein the metallic fine particles contained in the hydrophilic photosensitive layer are single or alloy metallic fine particles selected from the metallic elements belonging to group VIII or group I-B of the Periodic Table.

(7) The lithographic printing plate precursor as described in the above item (5) or (6), wherein an organic sulfur compound having at least one hydrophilic group and at least one metal-adsorbing group is adsorbed onto the surfaces of the metallic fine particles contained in the hydrophilic photosensitive layer.

(8) The lithographic printing plate precursor as described in the above item (5), (6) or (7), wherein the hydrophobitization precursor having a hydrophilic surface comprises composite particles containing a hydrophobic substance in the core parts and having hydrophilic property in the surface parts.

(9) The lithographic printing plate precursor as described in any of the above items (5) to (8), wherein a water-soluble protective layer is further provided on the hydrophilic photosensitive layer.

Key to the Symbols

Figure 1:
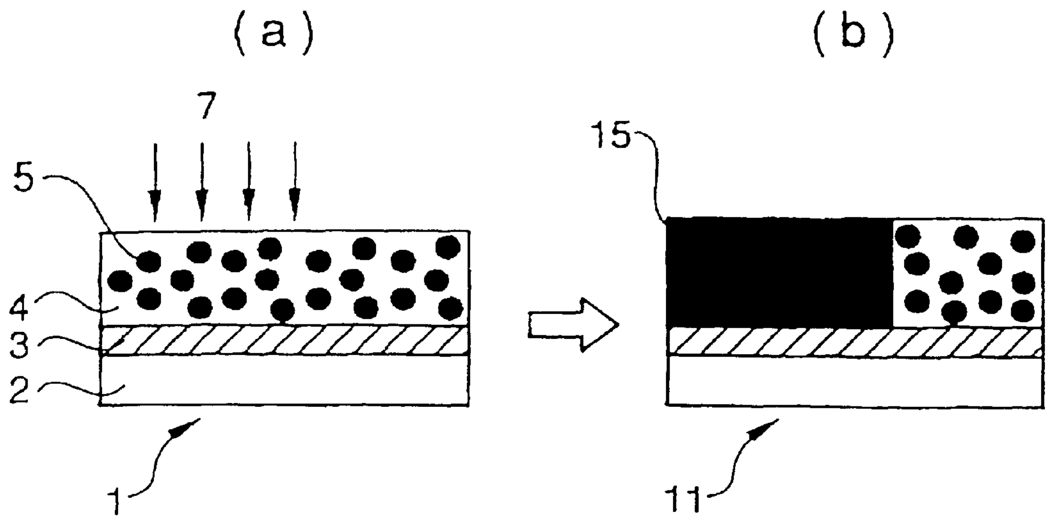
FIG. 1 is a drawing showing a typical example of a lithographic printing plate precursor according to the present invention and a plate-making process using the same.

1: Lithographic printing plate precursor
2: Support
3: Exothermic layer (lower layer)
4: Photosensitive layer (image-recording layer)
5: Metallic silver fine particles
6: Hydrophobitization precursor
7: Laser beams
11: Printing plate
15: Hydrophobic region due to fusion by heat

DETAILED DESCRIPTION OF THE INVENTION

A light-to-heat converting agent contained in the hydrophilic photosensitive layer having a hydrophilic surface of a lithographic printing plate precursor according to the present invention can be dispersed in a binder resin of the hydrophilic photosensitive layer and comprises metallic fine particles having a light-to-heat convertible function. Since these metallic fine particles have a light-to-heat converting property, i.e., a property of absorbing light energy and converting it into heat energy, if the irradiated light energy is sufficiently large, the metallic fine particles are fused by heat and a hydrophobic domain is imagewise formed on the surface of the hydrophilic photosensitive layer.

That is, the temperature rises more than the melting point of the metallic fine particles by the heat generated by light-to-heat conversion (this melting point is different from the melting point of physical properties due to sizing effect), as a result, the metallic fine particles are fused by heat and a hydrophobic domain comprising a metallic thin layer is imagewise formed on the surface of the hydrophilic photosensitive layer.

Further, particles having hydrophilic surfaces which hydrophobitize the vicinity by the work of heat, which will be described later, may be contained in the hydrophilic photosensitive layer together with light-to-heat convertible metallic fine particles which change to hydrophobic with the light-to-heat conversion. On the irradiated area at this time, particles having hydrophilic surfaces hydrophobitize the vicinity by the heat supplied from the metallic fine particles in addition to heat fusion of light-to-heat convertible metallic fine particles, thereby the inking property of an image area is improved to further improve the printing quality, and at the same time the discriminability is still further enhanced. In the present invention, these particles are called "a hydrophobitization precursor".

In such an image-recording means, when imaging is performed with high intensity such as laser beams, there are cases where a heat diffusion speed to a support is fast and recording is one-sided on the surface layer of the hydrophilic photosensitive layer, the hydrophilic photosensitive layer is not fused entirely by heat, which results in insufficient press life due to the abrasion during printing. If the intensity of laser beams is increased to avoid the insufficient hydrophobic layer formation, there arises a problem that the staining of the printing machine and the printing plate and printing staining are caused by heat splashing of the hydrophilic photosensitive layer. This problem can be solved by providing a layer containing a light-to-heat converting agent as the lower layer of the hydrophilic photosensitive layer. That is, since heat is supplied from the lower layer side according to the method of the present invention, while appropriately controlling the intensity of laser beams for image-drawing to suppress heat splashing, even the deep part of the upper layer can be used in image-recording. Further, since the lower layer functions as a barrier layer of heat conduction, escaping of heat from the hydrophilic photosensitive layer to the support can be prevented and sensitivity increases. When the support is a metal support (e.g., an aluminum plate), the preventing effect of heat escaping is large.

In addition, the adhesion between the layers can be improved by selecting a binder having the affinity with the support and the upper layer.

Further, when the surface of the hydrophilic photosensitive layer containing, as a light-to-heat converting agent, light-to-heat convertible metallic fine particles which change to hydrophobic with the conversion of light to heat is treated with an organic sulfur compound having at least one hydrophilic group and at least one metal-adsorbing group, the organic sulfur compound is adsorbed onto the metallic fine particles, thereby the hydrophilic property of the hydrophilic photosensitive layer is improved. Since the metallic fine particles are fused by heat and vanished due to imagewise irradiation, the function of the organic sulfur compound is also vanished. As a result, the difference between the non-irradiated area and the irradiated area becomes larger, thus the discriminability is further increased. In addition, since the thus-formed metal layer by heat fusion has great mechanical strength, excellent printing quality and press life can be obtained.

If a water-soluble protective layer is further provided on the upper hydrophilic layer, the printing plate precursor can be prevented from becoming hydrophobic by the atmospheric influences of the environment when the printing plate precursor is transported as a product, stored, or handled before use, from being affected by temperature and humidity, from being damaged mechanically or from staining. Since the water-soluble protective layer is dissolved in a fountain solution and washed away at the initial stage of printing, additional work of the removal is not necessary.

As described above, the surface layer of the fused metal of the metallic fine particles imagewise forms a hydrophobic domain on the irradiated area of the hydrophilic photosensitive layer, and further when a hydrophobitization precursor is added, the heat-fused precursor imagewise forms a hydrophobic domain, printing quality excellent in discriminability and excellent press life can be realized. Since the latitude in image exposure amount is broad at this time, the light amount for imagewise forming a hydrophobic domain can be easily adjusted, and it is possible to form an image with less exposure energy, thus the productivity increases.

Further, since the hydrophilic property of the non-irradiated area is improved by the treatment with an organic sulfur compound, the difference between the hydrophilicity on the non-irradiated area and the hydrophobicity on the irradiated area becomes larger, thus the discriminability is further increased. In addition, since the thus-formed heat-fused metal surface layer and heat-fused binder layer containing light-to-heat convertible substances, in particular the former, have great mechanical strength, excellent printing quality and press life can be obtained.

In addition, the plate-making process using the lithographic printing plate precursor of the present invention requires no development processing and is simple.

The plate-making process according to the present invention will be further described with referring to FIG. 1.

FIG. 1 is a drawing showing a plate-making process using a lithographic printing plate precursor according to the present invention. Lithographic printing plate precursor 1 according to the present invention shown on the left side in FIG. 1 (FIG. 1(*a*)) comprises support 2, exothermic layer 3 (lower layer 3) containing a light-to-heat converting agent provided on support 2, and hydrophilic photosensitive layer 4 (an image-recording layer) having a hydrophilic surface coated on lower layer 3. Metallic fine particles whose polarity changes with light-to-heat conversion, e.g., metallic silver fine particles 5, are contained in hydrophilic photosensitive layer 4. Printing plate 11 shown on the right side in FIG. 1 (FIG. 1(*b*)) shows that silver particles 5 are heat-fused and becomes heat-fused layer 15 of silver by the irradiation with laser beams 7 shown by the arrows from the upper part of printing plate precursor 1 on the left side, and a hydrophobic domain is formed on the irradiated area of the image-recording layer where silver fine particles have been vanished.

Figure 2:
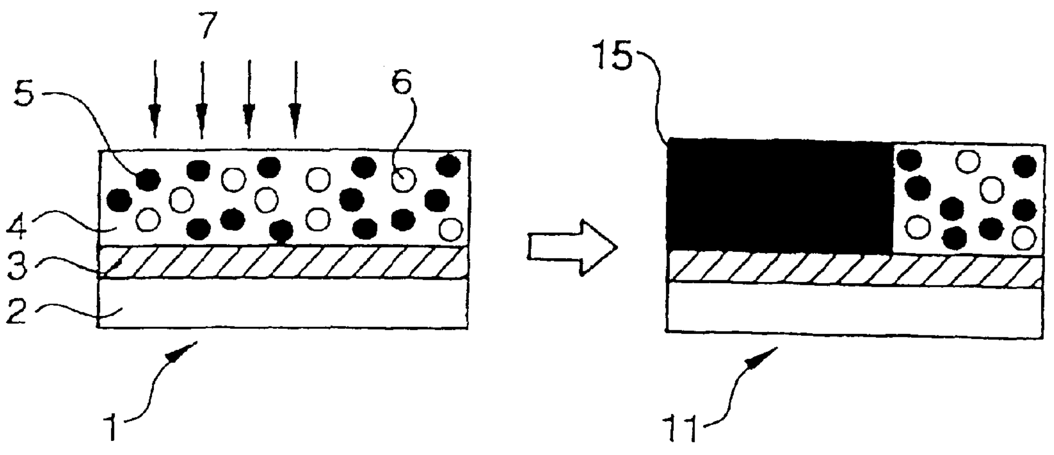
FIG. 2 is a drawing showing a preferred example of a lithographic printing plate precursor according to the present invention and a plate-making process using the same.

As the preferred embodiment, the plate-making process according to the present invention will be further described with referring to FIG. 2.

FIG. 2 is a drawing showing a plate-making process using a lithographic printing plate precursor according to the present invention. Lithographic printing plate precursor 1 according to the present invention shown on the left side in FIG. 2 comprises support 2, exothermic layer 3 (lower layer 3) containing a light-to-heat converting agent provided on support 2, and hydrophilic photosensitive layer 4 containing metallic fine particles 5 whose polarity changes with light-to-heat conversion and hydrophilic hydrophobitization precursor 6 coated on lower layer 3. Metallic fine particles 5 contained as the light-to-heat converting agent in hydrophilic photosensitive layer 4, are, e.g., metallic silver fine particles. Printing plate 11 shown on the right side in FIG. 2 shows that silver particles 5 are heat-fused and becomes heat-fused layer 15 of silver by the irradiation with laser beams 7 shown by the arrows from the upper part of printing plate precursor 1 on the left side, and a hydrophobic domain is formed on the surface of the irradiated area of the image-recording layer where silver fine particles have been vanished. At the same time, the hydrophobitization precursor also hydrophobitize the irradiated area by the work of heat and improves the inking property of the heat-fused layer.

The mode of execution of the present invention will be described in detail below.

In the present specification, sometimes the lower layer containing a light-to-heat converting agent is called "the exothermic layer", and the hydrophilic photosensitive layer containing light-to-heat convertible metallic fine particles is called "the upper layer" or "the image-recording layer".

Image-Recording Layer

As the light-to-heat convertible metallic fine particles contained as the light-to-heat converting agent in an image-recording layer having a hydrophilic surface, metallic fine particles which can be dispersed in a binder resin of the image-recording layer are used.

For exhibiting the effect of the present invention, it is necessary that the image-recording layer containing as the light-to-heat converting agent light-to-heat convertible metallic fine particles has a light-absorbing performance sufficient to bring about the above-described light fusion. The necessary light-absorbing performance means to have spectral absorption region of absorbance of 0.3 or more of transmission density in the spectral wavelength region of the irradiated light.

"The spectral wavelength region having 0.3 or more of transmission density" in the above specifically means when the irradiated light is single wavelength light, the wavelength region of 100 nm width with that wavelength as center, and when the irradiated light is continuous spectral light, the arbitrary wavelength region of continuous 100 nm width.

Moreover, the transmission density of an image-forming layer is the value measured based on International Standard ISO5-3 and ISO5-4.

Light-to-heat Convertible Metallic Fine Particles

Light-to-heat convertible metallic fine particles are described in the next place. The metallic fine particles for use in light-to-heat convertible metallic fine particles according to the present invention may be any metallic fine particles so long as they are light-to-heat convertible and fused by light irradiation, but preferred metals which constitute the metallic fine particles are single or alloy metals selected from the metallic elements belonging to group VIII or group I-B of the Periodic Table. Single or alloy metallic fine particles of Cu, Ag, Au, Pt and Pd are particularly preferred.

Metal colloids for use in the present invention can be obtained by adding an aqueous solution containing the above metal salts or metal complex salts to an aqueous solution containing a dispersion stabilizer, then further adding a reducing agent to the solution to make metal colloids, and then removing unnecessary salts.

As the dispersion stabilizers for use in the present invention, carboxylic acid such as citric acid and oxalic acid and the salts thereof, and polymers such as PVP, PVA, gelatin and acrylate resin can be used.

As the reducing agents for use in the present invention, base metal salts such as $FeSO_4$and $SnSO_4$, boron hydride compounds, formaldehyde, dextrin, glucose, Rochelle salt, tartaric acid, sodium thiosulfate, and hypophosphite can be exemplified.

The metal colloids for use in the present invention have an average particle size of from 1 to 500 nm, preferably from 1 to 100 nm, and more preferably from 1 to 50 nm. The degree of dispersion of the metal colloids may be polydispersion but is preferably monodispersion having a variation coefficient of 30% or less.

As the method for removing salts, an ultrafiltration method and a method of adding methanol/water or ethanol/water to colloidal dispersion and allowing to precipitate naturally or centrifugally, and then removing the supernatant can be used in the present invention.

The effect of the present invention can be further exhibited by subjecting the above-described single or alloy metallic fine particles to hydrophilizing surface treatment. Surface hydrophilization treatment with an organic sulfur compound which is hydrophilic and has the adsorptivity onto or reactivity with metallic fine particles is preferred. Further, surface treatment with a surfactant, provision of a hydrophilic film of protective colloid, and surface treatment with silicate are also effective. A method of immersing metallic fine particles in a 3% aqueous solution of sodium silicate at 70° C. for 30 seconds is preferred as the silicate surface treatment.

Light-to-heat convertible metallic fine particles whose polarity changes with light-to-heat conversion are contained in an image-recording layer in an amount of 2 wt % or more based on the solid constitutional components, and when these fine particles are a single layer-constitutional component, the content is substantially 100 wt %. When the image-recording layer comprises hydrophilic binder resin having dispersed therein metallic fine particles, the content of the metallic fine particles is from 2 to 95 wt %, preferably from 5 to 90 wt %. When the content is less than 2 wt %, the amount of heat generation becomes insufficient, while when it exceeds 95 wt %, the film strength lowers.

Hydrophobitization precursors which are preferably added to an image-recording layer (i.e., a hydrophilic photosensitive layer) are described below.

Hydrophobitization Precursor

Well-known various substances, i.e., fine particles, having hydrophilic surfaces and containing substances which hydrophobitize the vicinity by heat can be used as the hydrophilization precursor in the present invention. The hydrophilization precursors having hydrophilic surfaces described in the following items (1) and (2) are preferred in view of the hydrophobitizing effect and the dispersibility in an image-recording layer, but the present invention is not limited thereto.

(1) A precursor which is a particle dispersion having composite constitution containing a hydrophobic substance at the core part and having a hydrophilic property at a surface part, and the particles are broken due to the work of heat by light irradiation and light-to-heat conversion, and the incorporated hydrophobic substance makes the vicinity hydrophobic; and (2) A precursor which is a dispersion of particles having hydrophilic surfaces and being heat-crosslinkable, and exhibits hydrophobicity by the initiation of a crosslinking reaction due to the work of heat.

Hydrophobitization precursors are further described in detail below.

(1) A dispersion of particles having composite constitution containing a hydrophobic substance at the core part and having a hydrophilic surface layer at the surface part.

As the preferred forms of the particle dispersions of composite constitution in the above item (1), the following particles are included:

1) Composite particles having so-called hetero coagulation surface layers containing a thermoplastic resin which softens or melts by the temperature of heat mode image exposure as the cores and hydrophilic sol particle layers coagulated and adhered on the surfaces (hereinafter sometimes referred to as hetero coagulation surface layer particles), 2) Surface hetero phase composite particles containing a thermoplastic resin which softens or melts by the temperature of heat mode image exposure as the core and hydrophilic gel surface layers formed on the surfaces by processing a sol/gel substance by sol/gel conversion (hereinafter sometimes referred to as surface hetero phase particles), 3) Core/shell type composite particles comprising hydrophobic fine particles of a thermoplastic polymer obtained by dispersion polymerization as the core part and hydrophilic polymer layers formed around there (hereinafter sometimes referred to as core/shell type particles), 4) Emulsified particles comprising a thermodiffusible or thermoplastic hydrophobic organic compound emulsified and dispersed in a hydrophilic medium (hereinafter sometimes referred to as hydrophobic organic substance-containing particles), and 5) Microencapsulated particles comprising a hydrophobic core substance protected with a wall material having hydrophilic surface (hereinafter sometimes referred to as simply microencapsulated particles).

(2) A dispersion of heat-crosslinkable particles having hydrophilic surfaces

As the latter particle dispersions which exhibit hydrophobicity by the initiation of a crosslinking reaction by heat in the above item (2), mixed dispersions of a polymerizable monomer, a crosslinkable compound and a photopolymerization initiator can be exemplified.

Hetero Coagulation Surface Layer Particles

The hetero coagulation surface layer particles in the above item 1) of (1) contain particles of emulsified polymer dispersion of a thermo-softening or thermo-melting resin obtained by protecting a monomer with surfactant micelle, emulsifying-dispersing, and polymerizing, the resin particles soften and melt due to the effect of heat by light irradiation and light-to-heat conversion function, rupture the hydrophilic surface layers, and hydrophobitize the vicinities of the areas where they have been present as particles. The hydrophilic surface layer is a protective layer adsorbed around the emulsified polymer dispersion particles of the resin formed by adding sol state fine particle dispersion having relatively large hydrophilicity such as silica fine particles and alumina fine particles. The dispersion of the sol fine particles are the same as the sol fine particles described later in the components added to the medium of a hydrophilic image-recording layer.

Surface Hetero Phase Particles

The surface hetero phase particles in the above item 2) in (1) contain emulsified polymer dispersion particles of a thermo-softening or thermo-melting resin as core particles similarly to the particles in the above item 1), and the surfaces thereof are treated with a sol/gel convertible substance, which will be described later in the medium of a hydrophilic image-recording layer, to form a gel phase on the surfaces of particles.

Core/shell Type Particles

The core/shell type particles in the above item 3) in (1) contain particle dispersion of a resin which softens or melts by heat (hereinafter sometimes referred to as a thermoplastic resin) prepared by emulsifying and polymerizing the monomer as core particles (seeds), and a hydrophilic monomer is added to the dispersion solution and polymerized with the hydrophilic monomer on the surfaces of core particles to form core/shell type particles of foreign phase structure having hydrophilic surfaces.

A monomer which constitutes the core particle is selected from those for hydrophobic thermoplastic resins among groups A to L shown below as monomer components for high molecular weight compounds which will be described in the following item 4). A monomer for forming a hydrophilic shell phase can also be selected from the hydrophilic monomers among groups A to L.

Hydrophobic Organic Substance-containing Particles

The hydrophobic organic substance-containing particles in the above 4) in (1) take the form of particles comprising hydrophobic substance emulsified and dispersed in a hydrophilic medium and having hydrophilic surfaces. Due to the work of heat by heat mode light irradiation, emulsified particles cannot maintain the particle form any longer, and the vicinities of the precursors are hydrophobitized by exudation, diffusion and dissolution into the medium. Compounds suitable for this purpose can be found in hydrophobic organic low molecular weight compounds and organic high molecular weight compounds.

Organic Low Molecular Weight Compound

When hydrophobitization precursors contain organic low molecular weight compounds, the preferred organic low molecular weight compounds are solid or liquid organic compounds having a melting point of 300° C. or less and a boiling point of 100° C. or more at normal pressure, or organic high molecular weight compounds having the solubility in water or the water absorption is 2 g or less per 100 g of water. It is preferred embodiment of the present invention to use both compounds. Since organic low molecular weight compounds are comparatively high in diffusion permeability, when the mobility is given by heat, they diffuse to and hydrophobitize directly or indirectly the vicinities of the areas where they have been present. Compounds which are solid at normal temperature and diffuse by heat and form hydrophobic areas are included in this category. When the mobility is too large, hydrophobic area widens too much, and also the local centralization degree of heat energy lowers, as a result the effect of hydrophobitization decreases. Accordingly, the compounds which satisfy the above-described conditions of the melting point and the boiling point are preferred. Low molecular weight compounds in the present invention means compounds having a boiling point or a melting point and such compounds generally have a molecular weight of 2,000 or less, in many cases 1,000 or less.

The conditions of the above solubility or water absorption are the conditions found experimentally as the barometer that organic high molecular weight compounds are hydrophobic. On this condition, the hydrophobitization of the area in the vicinity of the particles can be exhibited by the change of the state of the organic high molecular weight compound near the area where the particles have been present due to the work of heat.

It is necessary that preferred organic low molecular weight compounds which meet the purpose of hydrophobitization should have extremely low solubility in water or high degree of organic property from the necessity that is capable of sufficiently hydrophobitizing the vicinities of the precursor by itself, apart from the viewpoint of the melting point and boiling point concerning the above-described mobility of the compound. As described above, that which specifically showing the condition is the case where the organic low molecular weight compound corresponds to at least either of (1) the solubility in 100 g of water at 25° C. is 2 g or less, or (2) the ratio of organic property/inorganic property in the organic conceptual drawing is 0.7 or more.

The organic conceptual drawing is the practical and simple standard to show the degree of organic property and inorganic property and details are described in Yoshio Tanaka, *Yuki Gainenzu* (*Organic Conceptual Drawing*), First Edition, pp. 1 to 31, Sankyo Shuppan Co., Ltd. (1983). The reason why the organic compounds in the above range on the organic conceptual drawing have the function of accelerating hydrophobitization is unknown but the compounds in this range have a relatively large organic property and hydrophobitize the vicinities of composite particles. The organic property of organic compounds on the organic conceptual drawing is 100 or more and the upper limit is not particularly limited, but the organic property is generally from 100 to 1,200, preferably from 100 to 800, the ratio of organic property/inorganic property is from 0.7 to infinity (i.e., inorganic property is 0),preferably from 0.9 to 10.

As the organic low molecular weight compounds having the boiling point falling in the above range, specifically aliphatic and aromatic hydrocarbons, aliphatic and aromatic carboxylic acids, aliphatic and aromatic alcohols, aliphatic and aromatic esters, aliphatic and aromatic ethers, organic amines, and organic silicon compounds can be exemplified, and various solvents and plasticizers which are known to be added to printing ink are exemplified, although the effect is not large.

The preferred aliphatic hydrocarbons are aliphatic hydrocarbons having from 8 to 30, more preferably from 8 to 20, carbon atoms, the preferred aromatic hydrocarbons are aromatic hydrocarbons having from 6 to 40, more preferably from 6 to 20, carbon atoms, the preferred aliphatic alcohols are aliphatic alcohols having from 2 to 30, more preferably from 2 to 18, carbon atoms, the preferred aromatic alcohols are aromatic alcohols having from 6 to 30, more preferably from 6 to 18, carbon atoms, the preferred aliphatic carboxylic acids are aliphatic carboxylic acids having from 2 to 24 carbon atoms, more preferably aliphatic monocarboxylic acids having from 2 to 20 carbon atoms, and aliphatic polycarboxylic acids having from 4 to 12 carbon atoms, the preferred aromatic carboxylic acids are aromatic carboxylic acids having from 6 to 30, more preferably from 6 to 18, carbon atoms, the preferred aliphatic esters are aliphatic esters having from 2 to 30, more preferably from 2 to 18, carbon atoms, the preferred aromatic esters are aromatic carboxylic acid esters having from 8 to 30, more preferably from 8 to 18, carbon atoms, the preferred aliphatic ethers are aliphatic ethers having from 8 to 36, preferably from 8 to 18, carbon atoms, and the preferred aromatic ethers are aromatic ethers having from 7 to 30, more preferably from 7 to 18, carbon atoms. Besides these, aliphatic or aromatic amides having from 7 to 30, more preferably from 7 to 18, carbon atoms can also be used.

Specific examples thereof include aliphatic hydrocarbon such as 2,2,4-trimethylpentane (isooctane), n-nonane, n-decane, n-hexadecane, octadecane, eicosane, methylheptane, 2,2-dimethylhexane, and 2-methyloctane; aromatic hydrocarbon such as benzene, toluene, xylene, cumene, naphthalene, anthracene, and styrene; monohydric alcohol such as dodecyl alcohol, octyl alcohol, n-octadecyl alcohol, 2-octanol, and lauryl alcohol; polyhydric alcohol such as propylene glycol, triethylene glycol, tetraethylene glycol, glycerol, hexylene glycol, and dipropylene glycol; aromatic alcohol such as benzyl alcohol, 4-hydroxytoluene, phenethyl alcohol, 1-naphthol, 2-naphthol, catechol, and phenol; monovalent aliphatic carboxylic acid such as acetic acid, propionic acid, butyric acid, caproic acid, acrylic acid, crotonic acid, caprylic acid, stearic acid, and oleic acid; polyvalent aliphatic carboxylic acid such as oxalic acid, succinic acid, adipic acid, maleic acid, and glutaric acid; aromatic carboxylic acid such as benzoic acid, 2-methylbenzoic acid, and 4-methylbenzoic acid; aliphatic ester such as ethyl acetate, isobutyl acetate, n-butyl acetate, methyl propionate, ethyl propionate, methyl butyrate, methyl acrylate, dimethyl oxalate, dimethyl succinate, and methyl crotonate; aromatic carboxylate such as methyl benzoate, and methyl 2-methylbenzoate; organic amine such as imidazole, triethanolamine, diethanolamine, cyclohexylamine, hexamethylenetetramine, triethylenetetramine, aniline, octylamine, aniline, and phenethylamine; ketones such as acetone, methyl ethyl ketone, methyl isobutyl ketone, and benzophenone; ether such as methoxybenzene, ethoxybenzene, methoxytoluene, laurylmethyl ether, and steary lmethyl ether; and amides such as stearylamide, benzoylamide, and acetamide. In addition, organic solvents having a boiling point within the above preferred range such as ethylene glycol monoethyl ether, cyclohexanone, butyl cellosolve, and cellosolve acetate can also be used.

Fats and oils such as linseed oil, soybean oil, poppy seed oil and safflower oil which are the components of printing ink, and plasticizers such as tributyl phosphate, tricresyl phosphate, dibutyl phthalate, butyl laurate, dioctyl phthalate, and paraffin wax can also be exemplified.

In addition, esters of long chain fatty acids and long chain monohydric alcohols, i.e., waxes, are also preferred low molecular weight organic compounds which are hydrophobic, have appropriately low melting point, fuse in the vicinity of light-to-heat convertible fine particles due to the heat brought about by light irradiation and hydrophobitize the area. Waxes preferably have a melting point of 50 to 200° C., and any of carnauba wax, castor wax, microcrystalline wax, paraffin wax, shellac wax, palm wax, and bees wax, which are called such by the raw material, can be used. In addition to waxes, fine particle dispersions of low molecular weight polyethylene; solid acids, e.g., oleic acid, stearic acid and palmitic acid; and metallic salts of long chain fatty acids, e.g., silver behenate, calcium stearate, and magnesium palmitate, can also be used.

Organic High Molecular Weight Compound

The preferred organic high molecular weight compounds which satisfy the above-described condition of solubility or water absorption are hydrophobic high molecular weight compounds soluble in the coexisting low molecular organic compounds or thermoplastic in themselves. For example, polyvinyl chloride, polyvinyl acetate, polyvinyl phenol, polyvinyl halogenated phenol, polyvinyl formal, polyvinyl acetal, polyvinyl butyral, polyamide, polyurethane, polyurea, polyimide, polycarbonate, epoxy resin, phenol, novolak, condensation resins of resol phenols with aldehyde or ketone, polyvinylidene chloride, polystyrene, acryl-based copolymerization resins, etc., can be exemplified.

One preferred compound is a phenol novolak resin or resol resin which is not necessarily thermoplastic but is soluble in organic low molecular weight compounds, and examples include novolak resins and resol resins of condensation with formaldehyde such as phenol, cresol (m-cresol, p-cresol, m/p mixed cresol), phenol/cresol (m-cresol, p-cresol, m/p mixed cresol), phenol modified xylene, tert-butylphenol, octyl-phenol, resorcinol, pyrogallol, catechol, chlorophenol (m-Cl, p-Cl), bromophenol (m-Br, p-Br), salicylic acid, and fluoroglucinol, and condensation resins of the above phenol compounds with acetone.

As other preferred high molecular weight compounds, copolymers with the monomers shown in (A) to (L) below as repeating units and have molecular weight of generally from 10,000 to 200,000 can be exemplified.

(A) Acrylamides, methacrylamides, acrylates, methacrylates, hydroxystyrenes, each having an aromatic hydroxyl group, e.g., N-(4-hydroxyphenyl)acrylamide, N-(4-hydroxyphenyl)-methacrylamide, o-, m- and p-hydroxystyrene, o-, m- and p-hydroxyphenyl acrylate or methacrylate (B) Acrylates and methacrylates each having an aliphatic hydroxyl group, e.g., 2-hydroxyethyl acrylate, or 2-hydroxyethyl methacrylate (C) (Substituted) acrylates, e.g., methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, and N-dimethylaminoethyl acrylate, etc.

(D) (Substituted) methacrylates, e.g., methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, and N-dimethylaminoethyl methacrylate, etc.

(E) Acrylamide or methacrylamide, e.g., acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide, and N-ethyl-N-phenylmethacrylamide, etc.

(F) Vinylethers, e.g., ethylvinylether, 2-chloroethyl vinyl ether, hydroxyethyl vinyl ether, propyl vinyl ether, butyl vinyl ether, octyl vinyl ether, phenyl vinyl ether, etc.

(G) Vinyl esters, e.g., vinyl acetate, vinyl chloroacetate, vinyl butyrate, vinyl benzoate, etc.

(H) Styrenes, e.g., styrene, methylstyrene, chloromethylstyrene, etc.

(I) Vinyl ketones, e.g., methyl vinyl ketone, ethyl vinyl ketone, propyl vinyl ketone, phenyl vinyl ketone, etc.

(J) Olefins such as ethylene, propylene, isobutylene, butadiene, isoprene, etc.

(K) N-vinylpyrrolidone, N-vinylcarbazole, 4-vinylpyridine, acrylonitrile, methacrylonitrile, etc.

(L) Acrylamides, e.g., N-(o-aminosulfonylphenyl) acrylamide, N-(m-aminosulfonylphenyl)acrylamide, N-(p-aminosulfonylphenyl)acrylamide, N-[1-(3-aminosulfonyl)naphthyl]acrylamide, and N-(2-aminosulfonylethyl)acrylamide, methacrylamide, e.g., N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide, and N-(2-aminosulfonylethyl)methacrylamide, unsaturated sulfonamides such as acrylate, e.g., o-aminosulfonylphenyl acrylate, m-aminosulfonylphenyl acrylate, p-aminosulfonylphenyl acrylate, and 1-(3-aminosulfonylphenylnaphthyl) acrylate, and unsaturated sulfonamides such as methacrylate, e.g., o-aminosulfonylphenyl methacrylate, m-aminosulfonylphenyl methacrylate, p-aminosulfonylphenyl methacrylate, and 1-(3-aminosulfonylphenylnaphthyl) methacrylate.

These organic high molecular weight compounds preferably have a weight average molecular weight of from 500 to 500,000 and a number average molecular weight of from 200 to 60,000.

Hydrophobitization precursors may comprise organic low molecular weight compounds alone, organic high molecular weight compounds alone, or may comprise both organic low molecular weight compounds and organic high molecular weight compounds. Further, the third components may be contained in hydrophobitization precursors for the purpose of improving the affinity of the organic low molecular weight compounds and organic high molecular weight compounds.

For hydrophilizing the surfaces of hydrophobitization precursors, e.g., a method of dispersing particles by adding a surfactant which is hydrophilic and adsorptive to hydrophobitization precursors to the hydrophobitization precursor to form a hydrophilic surfactant-adsorbed layer on the surfaces of particles; a method of forming protective colloidal, hydrophilic and surface-adsorptive high polymer coating, e.g., gelatin, polyvinyl alcohol, and polyvinyl pyrrolidone, in the above method; a dispersing method for further hydrophilizing and stabilizing the particle surfaces in the presence of a surfactant in the above method; and a method of surface treatment with a substance having a hydrophilic group reactive with the constitutional substances of the particles can be used in the present invention. The surfactants for use for surface hydrophilization of the hydrophobitization precursors can be selected for use from the compounds described as the surfactants which can be used in the image-recording layer and the exothermic layer.

The total weight of the hydrophobic constitutional components (the core part substances) in each hydrophobitization precursor having hydrophilic surface described in the above items 1) to 4) is generally from 10 to 95 wt %, preferably from 20 to 80 wt %, based on the total weight of the hydrophobitization precursor. Further, in item 4), when the organic low molecular weight compound and the organic high molecular weight compound are used together, the ratio of them may be arbitrary. On the other hand, the components forming a hydrophilic surface layer vary on surfactants, protective colloids, hydrophilic polymerization resins, hydrophilic sol, and sol/gel conversion components, according to the forms of 1) to 4). In some cases, these components are also contained in the media of image-recording layers. The weight of the components forming a hydrophilic surface layer of the hydrophobitization precursor is from 5 to 80 wt %, preferably from 10 to 50 wt %, based on the total weight of the hydrophobitization precursor.

The range of the optimal size of dispersion particles varies according to the forms of 1) to 4), but is preferably from 0.01 $\mu$m to 5 $\mu$m, more preferably from 0.05 to 2 $\mu$m, and particularly preferably from 0.1 to 0.5 $\mu$m, on volume average.

Microencapsulated Particles

The hydrophobitization precursor which is a constitutional material of microencapsulated particles and hydrophobitizes the vicinities due to the rupture of microcapsules by heat as described above in item 5) of a particle dispersion of composite constitution comprising a hydrophobic substance at the core part and having a hydrophilic surface layer at the surface part will be described below.

Microcapsules for use in the present invention can be produced by various well-known methods, and as the core substances (the substance contained in the capsule), the above-described organic low molecular weight compounds and organic high molecular weight compounds, further, organic solvents for mixing them can be used. That is, the microencapsulated particles can be prepared by emulsifying and dispersing the core substance after mixing the core substance and an organic solvent, or directly in an aqueous medium, and forming a wall film comprising a high molecular weight substance around an oil droplet. As the core substances in other categories, polymerizable monomers and/or crosslinkable compounds which form hydrophobic polymers, in particular crosslinking structures, in the vicinities of the particles by heat can be exemplified. The hydrophobitization precursors using these core substances can also be classified into the hydrophobitization precursors in item (2) described later, and so the details of the core substances comprising such polymerizable monomers and/or crosslinkable compounds are described later.

Specific examples of high molecular weight substances for the wall film of microcapsules include, e.g., a polyurethane resin, a polyurea resin, a polyamide resin, a polyester resin, a polycarbonate resin, an aminoaldehyde resin, a melamine resin, a polystyrene resin, a styrene-acrylate copolymer resin, a styrene-methacrylate copolymer resin, gelatin and polyvinyl alcohol. Particularly preferred are microcapsules having wall films comprising polyurethane-polyurea resins.

Microcapsules having wall films comprising polyurethane-polyurea resins are produced by mixing as an encapsulating agent a wall material such as polyvalent isocyanate.

Specific examples of polyvalent isocyanate compounds include diisocyanates, e.g., m-phenylene diisocyanate, p-phenylene diisocyanate, 2,6-tolylene diisocyanate, 2,4-tolylene diisocyanate, naphthalene-1,4-duisocyanate, diphenylmethane-4,4'-diisocyanate, 3,3'-diphenylmethane-4,4'-diisocyanate, xylene-1,4-diisocyanate, 4,4'-diphenylpropane diisocyanate, trimethylene diisocyanate, hexamethylene diisocyanate, propylene-1,2-diisocyanate, butylene-1,2-duisocyanate, cyclohexylene-1,2-diisocyanate, and cyclohexylene-1,4-diisocyanate, triisocyanates, e.g., 4,4',4"-triphenylmethane triisocyanate and toluene-2,4,6-truisocyanate, tetraisocyanates, e.g., 4,4'-dimethyldiphenylmethane-2,2',5,5'-tetraisocyanate, and isocyanate prepolymers, e.g., adducts of hexamethylene diisocyanate and trimethylolpropane, adducts of 2,4-tolylene diisocyanate and trimethylolpropane, adducts of xylylene diisocyanate and trimethylolpropane, and adducts of tolylene diisocyanate and hexanetriol, but the present invention is not limited to the above compounds. If necessary, two or more compounds can be used in combination. Particularly preferred of these are those having three or more isocyanate groups in the molecule.

As wall materials of microcapsules, the above-described gelatin, polyurea, polyurethane, polyimide, polyester, polycarbonate, melamine, etc., can be used, but polyurea and polyurethane walls are preferred for obtaining heat-responding microcapsules. For imparting heat-responding property to capsule walls, the capsule walls preferably have a glass transition point of from room temperature to 200° C., particularly preferably from 70 to 150° C.

For controlling the glass transition point of the capsule walls, the kinds of polymers of the capsule walls may be selected or it is possible to add an appropriate plasticizer. As such auxiliaries, a phenol compound, an alcohol compound, an amide compound, and a sulfonamide compound can be exemplified, and they can be contained in the core substance in the capsules, or they may be added to the outside of the capsules as a dispersion.

General methods of microencapsulation and the materials for use are disclosed in U.S. Pat. Nos. 3,726,804 and 3,796,696, which can be applied to the present invention.

The size of the microcapsule is preferably from 0.02 to 5 $\mu$m, more preferably from 0.05 to 0.7 $\mu$m, on volume average, in the light of the improvement of the resolution of images and handling.

Hydrophobitization precursor containing polymerizable monomer/crosslinkable compound and forming hydrophobic polymer/crosslinked structure in the vicinity of the particle due to rupture by heat:

The hydrophobitization precursor is a dispersion containing a polymerizable monomer having a heat-reactive functional group which does not react at normal temperature and causes a polymerization reaction or a crosslinking reaction by the work of heat and hydrophobitizes the vicinities of the precursor particles, and a crosslinkable compound. As the example thereof, a system containing a polymerizable monomer in which a polymerization reaction, in particular, a crosslinking reaction advances at high temperature, a heat-crosslinkable polymer and oligomer having a crosslinking group, and a thermal polymerization initiator can be exemplified. The surface hydrophilizing means described above in the hydrophobitization precursors in items 1), 2) and 4) can be used for the surface hydrophilization of this dispersion.

As the above-described heat-reactive functional groups, ethylenically unsaturated groups which conduct a polymerization reaction (e.g., an acryloyl group, a methacryloyl group, a vinyl group, an allyl group, etc.), isocyanate groups which conduct an addition reaction, or the block form of the isocyanate groups, and the functional groups having an active hydrogen atom of the opposite compound of the reaction (e.g., an amino group, a hydroxyl group, a carboxyl group, etc.), epoxy groups which conduct an addition reaction, and the amino group, the carboxyl group, and the hydroxyl group of the opposite compounds of the reaction, a carboxyl group and a hydroxyl group or an amino group which conduct a condensation reaction, and an acid anhydride and an amino group or a hydroxyl group which do a ring-opening addition reaction can be exemplified. However, if a chemical bond is formed, functional groups which conduct any reaction may be used in the present invention.

As the fine particle polymers having a heat-reactive functional group for use in the hydrophilic layer of the present invention, polymers having an acryloyl group, a methacryloyl group, a vinyl group, an allyl group, an epoxy group, an amino group, a hydroxyl group, a carboxyl group, an isocyanate group, an acid anhydride, and the protective groups of them can be exemplified. These groups may be incorporated into polymer particles at the time of polymerization or may be incorporated by utilizing a high polymer reaction after polymerization.

When these functional groups are incorporated into polymer particles at the time of polymerization, it is preferred that monomers having these functional groups undergo emulsion polymerization or suspension polymerization.

Specific examples of the monomers having such functional groups include allyl methacrylate, allyl acrylate, vinyl methacrylate, vinyl acrylate, glycidyl methacrylate, glycidyl acrylate, 2-isocyanatoethyl methacrylate or its block isocyanate by alcohol, etc., 2-isocyanatoethyl acrylate or its block isocyanate by alcohol, etc., 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, and bifunctional methacrylate, but the present invention is not limited thereto.

As the monomers copolymerizable with these monomers not having a heat-reactive functional group, e.g., styrene, alkyl acrylate, alkyl methacrylate, acrylonitrile, and vinyl acetate can be exemplified, but the present invention is not limited thereto if they are monomers not having a heat-reactive functional group.

High polymer reactions which are used in the case where a heat-reactive functional group is introduced after polymerization are disclosed, e.g., in WO 96/34316.

Of the above fine particle polymers having a heat-reactive functional group, fine particle polymers which coalesce with each other by heat are preferred, and those having hydrophilic surfaces and dispersible in water are particularly preferred. It is preferred that only fine particle polymers are coated and the contact angle of the film (water droplet in air) prepared by drying at lower temperature than the coagulation temperature is lower than the contact angle of the film (water droplet in air) prepared by drying at higher temperature than the coagulation temperature. Thus, when hydrophilic polymers such as polyvinyl alcohol and polyethylene glycol, or oligomers, or hydrophilic low molecular weight compounds are adsorbed onto the surfaces of the fine particle polymers, the surfaces of the fine particle polymers are made hydrophilic, but the method is not limited thereto.

The coagulation temperature of these fine particle polymers having heat-reactive functional groups is preferably 70° C. or higher, more preferably 100° C. or higher, in view of aging stability.

These fine particle polymers preferably have an average particle size of from 0.01 to 20 μm, more preferably from 0.05 to 2.0 μm, and particularly preferably from 0.1 to 1.0 μm. If the average particle size is too big, resolution becomes worse and if it is too small, aging stability is deteriorated.

The addition amount of these fine particle polymers having reactive functional groups is preferably 50 wt % or more, more preferably 60 wt % or more, based on the solids content of the heat-sensitive layer.

The microcapsules for use in the present invention may contain a compound having a heat-reactive functional group. As the compound having a heat-reactive functional group, compounds having at least one functional group selected from a polymerizable unsaturated group, a hydroxyl group, a carboxyl group, a carboxylate group, an acid anhydride, an amino group, an epoxy group, an isocyanate group, or the block form of isocyanate groups can be exemplified.

As the compound having a polymerizable unsaturated group, compounds having at least one, preferably two or more ethylenically unsaturated bonds, e.g., an acryloyl group, a methacryloyl group, a vinyl group or an aryl group. These compounds are well known in the field of this industry and these compounds can be used with no particular restriction in the present invention. As the chemical forms, they are monomers, prepolymers, i.e., diners, trimers, oligomers, and mixtures of them, or copolymers of them.

As specific examples of such compounds, unsaturated carboxylic acid (e.g., acrylic acid, methacrylic acid, itaconic acid, crotonic acid, isocrotonic acid, maleic acid, etc.), and esters and amides thereof can be exemplified, and preferably the esters of unsaturated carboxylic acid and aliphatic polyhydric alcohols, and the amides of unsaturated carboxylic acid and aliphatic polyhydric amines can be exemplified.

Further, the addition reaction products of unsaturated carboxylic acid esters or unsaturated carboxylic acid amides having nucleophilic substituents such as a hydroxyl group, an amino group, a mercapto group, etc., with monofunctional or polyfunctional isocyanates or epoxides, and the dehydration condensation reaction products of these unsaturated carboxylic acid esters or amides with monofunctional or polyfunctional carboxylic acids are also preferably used in the present invention.

Further, the addition reaction products of unsaturated carboxylic acid esters or amides having electrophilic substituents such as an isocyanate group and an epoxy group with monofunctional or polyfunctional alcohol, amine and thiol, and the substitution reaction products of unsaturated carboxylic acid esters or amides having eliminable substituents such as a halogen group and a tosyloxy group with monofunctional or polyfunctional alcohol, amine and thiol are also preferably used in the present invention.

As other preferred examples, the above compounds in which unsaturated carboxylic acid is substituted with unsaturated phosphonic acid or chloromethylstyrene can be exemplified.

Specific examples of the polymerizable compounds of esters of unsaturated carboxylic acids and aliphatic polyhydric alcohols include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane diacrylate, trimethylolpropane triacrylate, trimethylolpropane tris(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, etc.

As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloyloxy-2-hydroxypropoxy)phenyl]dimethylmethane, bis[p-(methacryloyloxyethoxy)phenyl]ddimethylmethane, etc.

As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

As crotonates, examples include ethylene glycol dicrotonate, tetramethylene glycol dicrotonate, pentaerythritol dicrotonate, sorbitol tetradicrotonate, etc.

As isocrotonates, examples include ethylene glycol diisocrotonate, pentaerythritol diisocrotonate, sorbitol tetraisocrotonate, etc.

As maleates, examples include ethylene glycol dimaleate, triethylene glycol dimaleate, pentaerythritol dimaleate, sorbitol tetramaleate, etc.

As examples of other esters, e.g., aliphatic alcohol esters disclosed in JP-B-46-27926, JP-B-51-47334 and JP-A-57-196231, esters having an aromatic skeleton disclosed in JP-A-59-5240, JP-A-59-5241 and JP-A-2-226149, and esters having an amino group disclosed in JP-A-1-165613 can be exemplified.

Further, examples of amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc.

As examples of other preferred amide monomers, those having cyclohexylene structure disclosed in JP-B-54-21726 can be exemplified.

Further, urethane-based addition polymerizable compounds produced by an addition reaction of isocyanate and a hydroxyl group are also preferably used, and as such specific examples, e.g., the urethane compound having two or more polymerizable unsaturated groups in one molecule obtained by adding an unsaturated monomer having a hydroxyl group represented by the following formula (I) to a polyisocyanate compound having two or more isocyanate groups in one molecule disclosed in JP-B-48-41708 can be exemplified.

$$CH_2{=}C(R_1)COOCH_2CH(R_2)OH \qquad (I)$$

wherein $R_1$ and $R_2$ each represents H or $CH_3$.

Further, the urethane acrylates as disclosed in JP-A-51-37193, JP-B-2-32293 and JP-B-2-16765, the urethane compounds having an ethylene oxide skeleton as disclosed in JP-B-58-49860, JP-B-56-17654, JP-B-62-39417 and JP-B-62-39418 can also be exemplified as preferred examples.

The radical polymerizable compounds having amino structure or sulfide structure in the molecule as disclosed in JP-A-63-277653, JP-A-63-260909 and JP-A-1-105238 can also be exemplified as preferred compounds.

As other preferred examples, polyfunctional acrylates and methacrylates such as the polyester acrylates, and the epoxy acrylates obtained by reacting epoxy resin and methacrylic acid as disclosed in JP-A-48-64183, JP-B-49-43191, and JP-B-52-30490 can be exemplified. In addition, the special unsaturated compounds disclosed in JP-B-46-43946, JP-B-1-40337, and JP-B-1-40336, and the vinyl sulfonic acid-based compounds disclosed in JP-A-2-25493 can also be exemplified as preferred compounds. Further, the compounds containing a perfluoroalkyl group disclosed in JP-A-61-22048 are preferably used in some cases. The monomers introduced into *Bulletin of Nihon Setchaku Kyokai*, Vol. 20, No. 7, pp. 300 to 308 (1984) as photosetting monomers and oligomers can also be used preferably.

As preferred examples of epoxy compounds, glycerol polyglycidyl ether, polyethylene glycol diglycidyl ether, polypropylene diglycidyl ether, trimethylolpropane polyglycidyl ether, sorbitol polyglycidyl ether, bisphenols and polyphenols or hydrogenated polyglycidyl ethers of them can be exemplified.

As preferred examples of isocyanate compounds, tolylene diisocyanate, diphenylmethane diisocyanate, polymethylenepolyphenyl polyisocyanate, xylylene diisocyanate, naphthalene diisocyanate, cyclohexanephenylene diisocyanate, isophorone diisocyanate, hexamethylene diisocyanate, cyclohexyl diusocyanate, or compounds obtained by blocking these compounds with alcohol or amine can be exemplified.

As preferred examples of amine compounds, ethylenediamine, diethylenetriamine, triethylenetetramine, hexamethylenediamine, propylenediamine, polyethyleneimine can be exemplified.

As preferred examples of the compounds having a hydroxyl group, compounds having methylol groups at terminals, polyhydric alcohol such as pentaerythritol, bisphenol/polyphenols can be exemplified.

As preferred examples of the compounds having a carboxyl group, aromatic polyvalent carboxylic acid such as pyromellitic acid, trimellitic acid, and phthalic acid, aliphatic polyvalent carboxylic acid such as adipic acid can be exemplified. As preferred acid anhydrides, pyromellitic anhydride and benzophenonetetracarboxylic anhydride can be exemplified.

As preferred examples of the copolymers of ethylenically unsaturated compounds, allyl methacrylate copolymers can be exemplified. For example, allyl methacrylate/methacrylic acid copolymers, allyl methacrylate/ethyl methacrylate copolymers, and allyl methacrylate/butyl methacrylate copolymers can be exemplified.

Since fine particle polymers having a heat-reactive functional group or microcapsules are used in the image-recording layer according to the present invention as described above, the compounds which initiate or accelerate these reactions can be used, if necessary. As the compounds which initiate or accelerate reactions, compounds which generate radicals or cations by heat can be exemplified, e.g., lophine dimers, trihalomethyl compounds, peroxides, azo compounds, onium salts containing diazonium salt or diphenyliodonium salt, acylphosphine, and imidosulfonate can be exemplified.

These compounds can be added in an amount of from 1 to 20 wt %, preferably from 3 to 10 wt %, based on the solids content of the heat-sensitive layer. Within this range, the development on machine is not impaired and good initiating or accelerating effects of the reaction can be obtained.

The addition amount of these polymerizable and crosslinkable organic compounds is from 5 to 95 wt %, preferably from 20 to 90 wt %, and most preferably from 30 to 80 wt %, based on the total weight of the hydrophobitization precursor.

Constitution of Image-recording Layer

The metallic fine particles of light-to-heat converting agent and the hydrophobitization precursor having a hydrophilic surface to be contained in the image-recording layer have been described. The constitution of the image-recording layer, i.e., the hydrophilic photosensitive layer, containing these compounds will be described below. Hereinafter, hydrophilic photosensitive layer has the same meaning as image-recording layer.

The layer constitution of the image-recording layer according to the present invention comprises a binder resin having dispersed therein metallic fine particles of a light-to-heat converting agent, preferably comprises a hydrophilic binder resin having dispersed therein metallic fine particles having hydrophilic surfaces.

Another preferred layer constitution of the image-recording layer according to the present invention comprises a binder resin having dispersed therein metallic fine particles of a light-to-heat converting agent and a hydrophobitization precursor having hydrophilic surfaces, more preferably comprises a hydrophilic binder resin having dispersed therein metallic fine particles having hydrophilic surfaces and a hydrophobitization precursor having hydrophilic surfaces.

In particular, it is preferred that a hydrophilic binder resin be a hydrophilic high molecular weight binder resin or a hydrophilic sol/gel convertible binder resin, above all, sol/gel convertible binder resins having the property of forming gel structure of polysiloxane is preferably used as the binder resin for their high hydrophilicity and high resistance against the rupture of the image-recording layer by thermal reaction. The hydrophilic binder resins for use in the image-recording layer will be described below.

Sol/gel Convertible Binder Resin Layer

Particularly preferred binders for the image-recording layer of the present invention are sol/gel convertible binder resins described below. The sol/gel convertible systems which are preferably applied to the present invention are polymers wherein the bonding groups of polyvalent elements form a network structure via oxygen atoms and, at the same time, polyvalent metals also have unbonded hydroxyl groups and alkoxyl groups and they are mixed and form resinous structure. The systems are in a sol state when there are many alkoxyl groups and hydroxyl groups, and the network resinous structure comes to heighten with the progress of ether bonding.

In addition to the property that the degree of the hydrophilicity of the resinous structure varies, the sol/gel convertible systems according to the present invention also have the function of bonding a part of the hydroxyl groups to the solid fine particles to modify the surfaces of the solid fine particles, to thereby change the degree of the hydrophilicity. The polyvalent bonding elements of the compounds having hydroxyl groups and alkoxyl groups performing sol/gel conversion are aluminum, silicon, titanium and zirconium, all of which can be used in the present invention. The sol/gel convertible systems by siloxane bonding which are most preferably used in the present invention are described below. Sol/gel conversion using aluminum, titanium and zirconium can be carried out by replacing respective elements with the following-described silicons.

That is, particularly preferred systems are sol/gel convertible systems containing silane compounds each having at least one silanol group.

The systems utilizing sol/gel conversion are further described below.

Inorganic hydrophilic binder resins formed by sol/gel conversion are preferably resins having a siloxane bond and a silanol group. The image-recording layer of the lithographic printing plate precursor according to the present invention is a sol system containing a silane compound having at least one silanol group, and hydrolysis condensation of the silanol group advances during the lapse of time after coating to form the structure of a siloxane skeleton, thus the image-recording layer is formed with the progress of gelation.

The layer formed by the sol/gel conversion may contain the organic hydrophilic polymers and crosslinking agents described later for the purpose of improving physical properties such as film strength and flexibility, and coating property.

A siloxane resin forming gel structure is represented by the following formula (I), and a silane compound having at least one silanol group is represented by the following formula (II). A material system contained in the image-recording layer is not necessarily composed of a silane compound represented by formula (II) alone, in general, the material may comprise the oligomer obtained by partial hydrolytic polymerization of the silane compound or a mixture of the silane compound and the oligomer thereof.

(I)

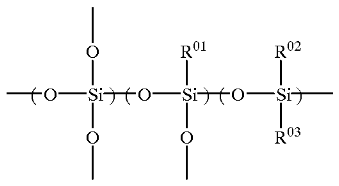

The siloxane resin represented by formula (I) is formed by sol/gel conversion from the dispersion solution containing at least one silane compound represented by the following formula (II) In formula (I), at least one of $R^{01}$, $R^{02}$ and $R^{03}$ represents a hydroxyl group, and the remaining represent(s) an organic residue selected from $R^0$ and Y in the following formula (II).

$$(R^0)_nSi(Y)_{4-n} \quad \text{(II)}$$

wherein $R^0$ represents a hydroxyl group, a hydrocarbon group or a heterocyclic group; Y represents a hydrogen atom, a halogen atom, —$OR^1$, —$OCOR^2$ or —$N(R^3)(R^4)$; (wherein $R^1$ and $R^2$ each represents a hydrocarbon group, and $R^3$ and $R^4$, which may be the same or different, each represents a hydrogen atom or a hydrocarbon group); and n represents 0, 1, 2 or 3.

Examples of the hydrocarbon groups or the heterocyclic groups represented by $R^0$ in formula (II) include a substituted or unsubstituted straight chain or branched alkyl group having from 1 to 12 carbon atoms [e.g., methyl, ethyl, propyl, butyl, pentyl, hexyl, heptyl, octyl, nonyl, decyl, dodecyl; each of which may be substituted with one or more substituents such as a halogen atom (e.g., chlorine, fluorine, bromine), a hydroxyl group, a thiol group, a carboxyl group, a sulfo group, a cyano group, an epoxy group, an —OR' group (wherein R' represents methyl, ethyl, propyl, butyl, heptyl, hexyl, octyl, decyl, propenyl, butenyl, hexenyl, octenyl, 2-hydroxyethyl, 3-chloropropyl, 2-cyanoethyl, N,N-dimethylaminoethyl, 2-bromoethyl, 2-(2-methoxyethyl)oxyethyl, 2-methoxycarbonylethyl, 3-carboxypropyl, benzyl), an —OCOR" group (wherein R" has the same meaning as R'), a —COOR" group, a —COR" group, an —N(R''')(R''') group (wherein R''' represents hydrogen or the same group as R', two R''' may be the same or different), an —NHCONHR" group, an —NHCOOR" group, an —$Si(R")_3$ group, a —CONHR''' group and an —NHCOR" group], a substituted or unsubstituted straight chain or branched alkenyl group having from 2 to 12 carbon atoms (e.g., vinyl, propenyl, butenyl, pentenyl, hexenyl, octenyl, decenyl, dodecenyl, each of which may be substituted with the same substituent as described above for the alkyl group), a substituted or unsubstituted aralkyl group having from 7 to 14 carbon atoms (e.g., benzyl, phenethyl, 3-phenylpropyl, naphthylmethyl, 2-naphthylethyl, each of which may be substituted with one or more substituents which is (are) the same substituent(s) as described above for the alkyl group), a substituted or unsubstituted alicyclic group having from 5 to 10 carbon atoms (e.g., cyclopentyl, cyclohexyl, 2-cyclohexylethyl, 2-cyclopentylethyl, norbornyl, adamantyl, each of which may be substituted with one or more substituents which is(are) the same substituent(s) as described above for the alkyl group), a substituted or unsubstituted aryl group having from 6 to 12 carbon atoms (e.g., phenyl, naphthyl, each of which may be substituted with one or more substituents which is (are) the same substituent(s) as described above for the alkyl group), and a heterocyclic group containing at least one atom selected from a nitrogen atom, an oxygen atom and a sulfur atom which may be condensed (examples of the hetero atoms include a pyran ring, a furan ring, a thiophene ring, a morpholine ring, a pyrrole ring, a thiazole ring, an oxazole ring, a pyridine ring, a piperidine ring, a pyrrolidone ring, a benzothiazole ring, a benzoxazole ring, a quinoline ring, and a tetrahydrofuran ring, each of which may be substituted with one or more substituents which is (are) the same substituent(s) as described above for the alkyl group).

The substituents of the —$OR^1$ group, —$OCOR^2$ group and —$N(R^3)(R^4)$ group represented by Y in formula (II) are as follows.

In the —$OR^1$ group, $R^1$ represents a substituted or unsubstituted aliphatic group having from 1 to 10 carbon atoms (e.g., methyl, ethyl, propyl, butyl, heptyl, hexyl, pentyl, octyl, nonyl, decyl, propenyl, butenyl, heptenyl, hexenyl, octenyl, decenyl, 2-hydroxyethyl, 2-hydroxypropyl, 2-methoxyethyl, 2-(methoxyethyloxo)ethyl, 2-(N,N-diethylamino)ethyl, 2-methoxypropyl, 2-cyanoethyl, 3-methyloxapropyl, 2-chloroethyl, cyclohexyl, cyclopentyl, cyclooctyl, chlorocyclohexyl, methoxycyclohexyl, benzyl, phenethyl, dimethoxybenzyl, methylbenzyl, bromobenzyl).

In the —$OCOR^2$ group, $R^2$ represents the same aliphatic group as in $R^1$, or a substituted or unsubstituted aromatic group having from 6 to 12 carbon atoms (e.g., the same aryl group as described above for $R^0$).

In the —$N(R^3)(R^4)$ group, $R^3$ and $R^4$, which may be the same or different, each represents a hydrogen atom or a substituted or unsubstituted aliphatic group having from 1 to 10 carbon atoms (e.g., the same groups described for $R^1$ in the —$OR^1$ group).

More preferably the total number of the carbon atoms contained in $R^3$ and $R^4$ is not more than 16.

Specific examples of the silane compounds represented by formula (II) are shown below, but the present invention is not limited to these compounds: tetrachlorosilane, tetrabromosilane, tetramethoxysilane, tetraethoxysilane, tetraisopropoxysilane, tetra-n-propylsilane, tetra-t-butoxysilane, tetra-n-butoxysilane, methyltrichlorosilane, methyltribromosilane, methyltrimethoxysilane, methyltriethoxysilane, methyltriisopropoxysilane, methyltri-t-butoxysilane, ethyltrichlorosilane, ethyltribromosilane, ethyltrimethoxysilane, ethyltriethoxysilane, ethyltriisopropoxysilane, ethyltri-t-butoxysilane, n-propyltrichlorosilane, n-propyltribromosilane, n-propyltrimethoxysilane, n-propyltriethoxysilane, n-propyltriisopropoxysilane, n-propyltri-t-butoxysilane, n-hexyltrichlorosilane, n-hexyltribromosilane, n-hexyltrimethoxysilane, n-hexyltriethoxysilane, n-hexyltriisopropoxysilane, n-hexyltri-t-butoxysilane, n-decyltrichlorosilane, n-decyltribromosilane, n-decyltrimethoxysilane, n-decyltriethoxysilane, n-decyltriisopropoxysilane, n-decyltri-t-butoxysilane, n-octadecyltrichlorosilane, n-octadecyltribromosilane, n-octadecyltrimethoxysilane, n-octadecyltriethoxysilane, n-octadecyltriisopropoxysilane, n-octadecyltri-t-butoxysilane, phenyltrichlorosilane, phenyltribromosilane, phenyltrimethoxysilane, phenyltriethoxysilane, phenyltriisopropoxysilane, phenyltri-t-butoxysilane, dimethoxydiethoxysilane, dimethyldichlorosilane, dimethyldibromosilane, dimethyldimethoxysilane, dimethyldiethoxysilane, diphenyldichlorosilane, diphenyldibromosilane, diphenyldimethoxysilane, diphenyldiethoxysilane, phenylmethyldichlorosilane, phenylmethyldibromosilane, phenylmethyldimethoxysilane, phenylmethyldiethoxysilane, triethoxyhydrosilane, tribromohydrosilane, trimethoxyhydrosilane, isopropoxyhydrosilane, tri-t-butoxyhydrosilane, vinyltrichlorosilane, vinyltribromosilane, vinyltrirmethoxysilane, vinyltriethoxysilane, vinyltruisopropoxysilane, vinyltri-t-butoxysilane, trifluoropropyltrichlorosilane, trifluoropropyltribromosilane, trifluoropropyltrimethoxysilane, trifluoropropyltriethoxysilane, trifluoropropyltriisopropoxysilane, trifluoropropyltri-t-butoxysilane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri-t-butoxysilane, γ-methacryloxypropylmethyldimethoxysilane, γ-methacryloxypropylmethyldiethoxysilane, γ-methacryloxypropyltrimethoxysilane, γ-methacryloxypropyltriisopropoxysilane, γ-methacryloxypropyltri-t-butoxysilane, γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri-t-butoxysilane, γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri-t-butoxysilane, β-(3,4-epoxycyclohexyl)ethyltrimethoxysilane, and β-(3,4-epoxycyclohexyl)ethyltriethoxysilane.

In combination with the silane compound represented by formula (II) for use for forming the inorganic hydrophilic binder resin for the hydrophilic layer, metallic compounds, e.g., Ti, Zn, Sn, Zr, Al, etc., capable of forming a film by bonding to resins in sol/gel conversion can be used.

Examples of the metallic compounds for use in combination include, e.g., $Ti(OR'')_4$ (wherein R" represents methyl, ethyl, propyl, butyl, pentyl, hexyl), $TiCl_4$, $Zn(OR'')_2$, $Zn(CH_3COCHCOCH_3)_2$, $Sn(OR'')_4$, $Sn(CH_3COCHCOCH_3)_4$, $Sn(OCOR'')_4$, $SnCl_4$, $Zr(OR'')_4$, $Zr(CH_3COCHCOCH_3)_4$, $Al(OR'')_3$, $Al(CH_3COCHCOCH_3)_3$, etc.

For the purpose of accelerating the hydrolysis and the polymerization condensation reaction of the silane compound represented by formula (II) and the above-described metallic compound used in combination, it is preferred to use an acidic catalyst or a basic catalyst together.

The catalyst for use for the above purpose is an acidic or basic compound as it is, or dissolved in water or a solvent such as alcohol (such a compound is hereinafter referred to as an acidic catalyst or a basic catalyst). The concentration of the catalyst is not particularly restricted but when the catalyst with high concentration is used, the hydrolysis rate and the polycondensation rate are liable to be increased. However, since the basic catalyst used in high concentration sometimes causes precipitation in the sol solution, it is preferred that the concentration of the basic catalyst is 1N (in terms of the concentration in the aqueous solution) or less.

The kinds of the acidic catalyst or the basic catalyst are not restricted but when the use of the catalysts in high concentration is required, catalysts constituted of the elements which hardly remain in the catalyst crystals after sintering are preferred. Specific examples of acidic catalysts include hydrogen halide (e.g., hydrochloric acid), nitric acid, sulfuric acid, sulfurous acid, hydrogen sulfide, perchloric acid, hydrogen peroxide, carbonic acid, carboxylic acids (e.g., formic acid and acetic acid), substituted carboxylic acid (e.g., R of the structural formula RCOOH is substituted with other elements or substituents), and sulfonic acid (e.g., benzenesulfonic acid), and specific examples of the basic catalysts include ammoniacal bases (e.g., aqueous ammonia), and amines (e.g., ethylamine and aniline).

As described above, the image-recording layer produced by the sol/gel method is particularly preferably used for the lithographic printing plate precursor according to the present invention. The details of the sol/gel method are described in Sumio Sakibana, *Sol/Gel Ho no Kagaku* (*Science of Sol/Gel Method*), Agune Shofu-Sha (1988) and Seki Hirashima, *Saishin Sol/Gel Ho ni yoru Kino-Sei Hakumaku Sakusei Gijutsu* (*Producing Techniques of Functional Thin Films by the Latest Sol/Gel Methods*), Sogo Gijutsu Center (1992).

Hydrophilic High Molecular Weight Compound

As the binder resins contained in the image-recording layer of the lithographic printing plate precursor according to the present invention, other than the above sol/gel convertible binder resins, an organic high molecular weight compound having a hydroxyl group can be used for giving appropriate strength as the image-recording layer and hydrophilicity to the surface layer.

Specific examples of such compounds include polyvinyl alcohol (PVA), modified PVA such as carboxyl-modified PVA, starch and derivatives thereof, cellulose derivatives such as carboxymethyl cellulose and hydroxyethyl cellulose, casein, gelatin, polyvinyl pyrrolidone, vinyl acetate-crotonic acid copolymer, styrene-maleic acid copolymer, alginic acid and alkali metal salts thereof, alkaline earth metal salts or ammonium salts, polyacrylic acid, polyacrylate, poly (ethylene oxide), water-soluble resins such as water-soluble urethane resins, water-soluble polyester resins, polyhydroxyethyl acrylate, polyethylene glycol diacrylate-based polymers, and N-vinylcarboxylic acid amide polymers.

As waterproofing agents for crosslinking and curing the above-described organic high molecular weight compounds having a hydroxyl group, glyoxal, aldehydes such as melamine-formaldehyde resins and urea-formaldehyde resins, methylol compounds such as N-methylolurea, N-methylolmelamine, and methylolated polyamide resins, active vinyl compounds such as divinyl sulfone and bis(B-hydroxyethylsulfonic acid), epoxy compounds such as epichlorohydrin, polyethylene glycol diglycidyl ether, polyamide-polyamine-epichiorohydrin adducts, and polyamide epichlorohydrin resins, ester compounds such as monochloroacetate and thioglycolate, polycarboxylic acids such as polyacrylic acid, methyl vinyl ether-maleic acid copolymers, boric acid, titanyl sulfate, inorganic crosslinking agents such as salts of Cu, Al, Sn, V and Cr, and modified polyamide-polyimide resins can be exemplified.

In addition, crosslinking catalysts such as ammonium chloride, a silane coupling agent, and a titanate coupling agent can be used in combination.

In the present invention, among the organic high molecular weight compounds having a hydroxyl group, gelatin is preferably mainly used.

Gelatin is a kind of derived protein and there is no particular limitation and gelatins produced from any collagen can be used. Preferred gelatins are light in color, transparent, tasteless and odorless. Further, photographic gelatin is preferably used because physical properties, such as the viscosity as an aqueous solution, jelly strength of gel, are within a constant range.

When gelatin is used as the binder resin for the image-recording layer, it is preferred to use gelatin-hardening compounds in combination to harden the layer and improve water resistance.

Well-known gelatin-hardening compounds can be used in the present invention. With respect to gelatin-hardening compounds, e.g., T. H. James, *The Theory of the Photographic Processes*, Chap. 2, Section III, Macmillan Publishing Co., Inc. (1977), and *Research Disclosure*, No. 17643, p. 26 (December, 1970) can be referred to.

Preferred examples of gelatin-hardening compounds 3include dialdehydes (e.g., succinaldehyde, glutaraldehyde, and adipoaldehyde), diketones (e.g., 2,3-butanedione, 2,5-hexadione, 3-hexene-2,5-dione, 1,2-cyclopentadione, etc.), and active olefin compounds having 2 or more double bonds bonded to electron attractive groups adjacently.

The amount of the gelatin-hardening compound is preferably from 0.5 to 20 weight parts, more preferably from 0.8 to 10 weight parts, per 100 weight parts of the gelatin.

The image-recording layer obtained with this range of the gelatin-hardening compound retains film strength, shows a water resisting property and, at the same time, does not hinder the hydrophilicity of the image-recording layer.

Other Additives to Image-recording Layer

Besides the above-described metallic fine particles, hydrophobitization precursor and hydrophilic binder resin, the image-recording layer can contain various compounds for the purpose of controlling the degree of hydrophilicity, improving the physical strength of the image-recording layer, improving the mutual dispersibility of the compositions constituting the layer, improving coating properties, improving printing aptitude, and for the facilitation of platemaking work. As such additives, the following compounds can be exemplified.

Hydrophilic Sol Particles

Examples of the inorganic fine particles which can be added to the image-recording layer include hydrophobic sols such as titanium oxide, hydrous titanium oxide, zinc oxide, iron hydroxide, silica, alumina, magnesium oxide, magnesium carbonate, and calcium alginate, more preferred examples include titanium oxide dispersed in a sol state, hydrous titanium oxide, zinc oxide, iron hydroxide, silica, alumina, calcium alginate, and mixtures of these compounds. These compounds can be used for strengthening film strength and improving interfacial adhesion property by surface roughening even if they are not light-to-heat convertible. When these inorganic fine particles are added to the image-recording layer, the content is from 1 to 70% by weight, preferably from 5.0 to 50% by weight, based on the solid constitutional components. If the content is less than 1% by weight, a desired effect cannot be obtained, and if more than 70% by weight, it is feared that the addition amount of the essential light-to-heat converting agent is restricted.

Hydrophilic particles in a sol state are not especially limited. Preferred examples of hydrophilic sol particles include silica sol, alumina sol, magnesium oxide, magnesium carbonate, and calcium alginate. These compounds can be used for increasing hydrophilicity and improving the strength of sol/gel film even if they are not light-to-heat convertible. More preferred are silica sol, alumina sol, calcium alginate and mixtures of them.

A silica sol has many hydroxyl groups on the surface, and the inside constitutes a siloxane bond (—Si—O—Si—). A silica sol is also called a colloidal silica which comprises ultra-super fine silica particles having a particle size of from 1 to 100 nm dispersed in water or polar solvents. A silica sol is specifically described in, supervised by Toshiro Kagami and Akira Hayashi, *Kojundo Silica no Oyo Gijutsu* (*Application Techniques of High Purity Silica*), Vol. 3, published by CMC Publishing Co., Ltd. (1991).

An alumina sol is an alumina hydrate (boehmite-based) having a particle size of from 5 to 200 nm, and dispersed in water with the anions in water as a stabilizer (e.g., a halide ion such as a fluorine ion and a chlorine ion, and carboxylate anions such as an acetate ion).

The above hydrophilic sol particles preferably have an average particle size of from 10 to 50 nm, more preferably from 10 to 40 nm. All of these hydrophilic sol particles are easily commercially available.

When the particle size of hydrophilic sol particles (hereinafter they are sometimes merely referred to as silica particles) falls within the above-described range, metallic fine particles of a light-to-heat converting agent, hydrophobitization precursor for use in combination, an infrared ray-absorbing dye, and carbon black are dispersed stably in the binder resin, film strength of the obtained image-recording layer is sufficiently retained, and when the printing plate precursor is irradiated with laser beams and the like to make a printing plate and printing is performed, the printing plate generates no staining due to inking property to the non-image area, which shows that the hydrophilicity is remarkably excellent.

The ratio of the silica particles which may be used in combination with the metallic fine particles of the present invention is from 100/0 to 30/70 by weight ratio (metallic fine particles or carbon black/silica particles), preferably from 100/0 to 40/60 by weight ratio.

When metallic fine particles and hydrophilic sol particles are added to the image-recording layer, the addition amount in total is from 2 to 95 wt %, preferably from 5 to 85 wt %, based on the solids content in the image-recording layer.

Further, when metallic fine particles, hydrophobitization precursor and hydrophilic sol particles are added to the image-recording layer, the addition amount in total is from 2 to 95 wt %, preferably from 5 to 85 wt %, based on the solids content in the image-recording layer.

Organic High Molecular Weight Compound

The image-recording layer can contain an organic high molecular weight compound for controlling the degree of hydrophilicity, increasing the strength of the image-recording layer and improving the mutual solubility of other components constituting the image-recording layer. Examples of the organic high molecular compounds to be added include, e.g., polyvinyl chloride, polyvinyl acetate, polyvinyl phenol, halogenated polyvinyl phenol, polyvinyl formal, polyvinyl acetal, polyvinyl butyral, polyamide, polyurethane, polyurea, polyimide, polycarbonate, epoxy resin, phenol novolak, condensation resins of resol phenols and aldehyde or ketone, polyvinylidene chloride, polystyrene and silicone resins.

Organic high molecular weight compounds consisting of aqueous emulsions are preferably used in the image-recording layer of the present invention. An aqueous emulsion is an aqueous solution of a hydrophobic polymer suspension comprising fine polymer particles and, if necessary, a protective agent for stabilizing the dispersion of the polymer particles dispersed in water.

Specific examples of the aqueous emulsions for use in the present invention include vinyl-system polymer latex (polyacrylate-system, vinyl acetate-system, and ethylene-vinyl acetate-system latexes), conjugated diene-system polymer latexes (methyl methacrylate-butadiene-system, styrene-butadiene-system, acrylonitrile-butadiene-system, chloroprene-system), and polyurethane resins.

When organic high molecular weight compounds are added to the image-recording layer, the addition amount is from 1 to 20 wt %, preferably from 2 to 10 wt %, based on the solids content in the image-recording layer.

Surfactant

For widening the stability to printing conditions, the image-forming layer of the lithographic printing plate precursor of the present invention can contain the cationic surfactants and fluorine-containing surfactants as disclosed in JP-A-2-195356, and the ampholytic surfactants as disclosed in JP-A-59-121044 and JP-A-4-13149, in addition to the above-described nonionic and anionic surfactants.

Specific examples of nonionic surfactants include polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl-aryl ethers (e.g., polyoxyethylene nonylphenyl ether), polyoxyethylene-polyoxypropylene block copolymers, composite polyoxyalkylene alkyl ethers wherein from 5 to 24 aliphatic groups are bonded to the terminal hydroxyl groups of polyoxyethylene-polyoxypropylene block copolymer by ether bonding, composite polyoxyalkylene alkylaryl ethers wherein alkyl-substituted aryl groups are bonded to the terminal hydroxyl groups of polyoxyethylene-polyoxypropylene block copolymer by ether bonding, sorbitan fatty acid esters (e.g., sorbitan monolaurate, sorbitan monostearate, sorbitan tristearate, sorbitan monopalmitate, sorbitan monooleate, sorbitan trioleate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan tristearate, polyoxyethylene sorbitan trioleate).

Specific examples of ampholytic surfactants include alkyldi(aminoethyl) glycine, alkylpolyaminoethyl glycine hydrochloride, 2-alkyl-N-carboxyethyl-N-hydroxyethyl-imidazolinium betaine and N-tetradecyl-N,N-betaine (e.g., Amorgen K (trade name), manufactured by Daiichi Kogyo Seiyaku Co., Ltd.).

Specific examples of anionic surfactants include alkylsulfonic acids, arylsulfonic acids, aliphatic carboxylic acids, alkylnaphthalenesulfonic acids, condensation products of alkylnaphthalenesulfonic acid or naphthalenesulfonic acid with formaldehyde, aliphatic sulfonic acids having from 9 to 26 carbon atoms, alkylbenzenesulfonic acids, and polyoxyethylene-containing sulfuric acids and polyoxyethylene-containing phosphoric acids (e.g., lauroylpolyoxyethylene sulfuric acid, cetylpolyoxyethylene sulfonic acid, and oleylpolyoxyethylene phosphonic acid.

Specific examples of cationic surfactants include laurylamine acetate, lauryltrimethylammonium chloride, distearyldimethylammonium chloride, and alkylbenzyldimethylammonium chloride.

According to cases, the image-recording layer may use a fluorine-containing surfactant within the above-described addition amount range of surfactants. Specifically, surfactants having a perfluoroalkyl group are preferably used, e.g., anionic surfactants having any of carboxylic acid, sulfonic acid, sulfate and phosphate, cationic surfactants such as aliphatic amine and quaternary ammonium salt, betaine type ampholytic surfactants, and nonionic surfactants such as aliphatic esters of polyoxy compounds, polyalkylene oxide condensation type, and polyethyleneimine condensation type can be exemplified.

The addition amount of these surfactants is preferably from 0.05 to 15% by weight, more preferably from 0.1 to 5% by weight, based on the total solids content in the image-recording layer.

Exothermic Layer

The exothermic layer is described in the next place.

The exothermic layer provided as the lower layer of the hydrophilic layer is low in heat conduction and functions to suppress heat diffusion to the support.

The exothermic layer comprises organic or inorganic resin and a light-to-heat converting agent as the light source.

Organic or inorganic resins can be selected broadly from hydrophilic or hydrophobic resins. Examples of hydrophobic resins include polyethylene, polypropylene, polyester, polyamide, acrylate resin, vinyl chloride resin, vinylidene chloride resin, polyvinyl butyral resin, nitrocellulose, polyacrylate, polymethacrylate, polycarbonate, polyurethane, polystyrene, vinyl chloride resin-vinyl acetate copolymer, vinyl chloride-vinyl acetate-vinyl alcohol copolymer, vinyl chloride-vinyl resin-maleic acid copolymer, and vinyl chloride-acrylonitrile copolymer, polyvinylidene chloride and vinylidene-acrylonitrile copolymer.

Hydrophobic resins consisting of aqueous emulsions are preferably used in the image-recording layer of the present invention. An aqueous emulsion is an aqueous solution of a hydrophobic polymer suspension comprising fine polymer particles and, if necessary, a protective agent for stabilizing the dispersion of the polymer particles dispersed in water.

Specific examples of the aqueous emulsions for use in the present invention include vinyl-system polymer latex (polyacrylate-system, vinyl acetate-system, and ethylene-vinyl acetate-system latexes), conjugated diene-system polymer latexes (methyl methacrylate-butadiene-system, styrene-butadiene-system, acrylonitrile-butadiene-system, chloroprene-system), and polyurethane resins.

Specific examples of the resins having hydrophilicity include polyvinyl alcohol (PVA), modified PVA such as carboxyl-modified PVA, starch and derivatives thereof, cellulose derivatives such as carboxymethyl cellulose and hydroxyethyl cellulose, ammonium alginate, polyacrylic acid, polyacrylate, polyethylene oxide, water-soluble urethane resin, water-soluble polyester resin, water-soluble resins such as polyhydroxyethyl acrylate, polyethylene glycol diacrylate-system polymer, N-vinyl carboxylic acid amide polymer, casein, gelatin, polyvinyl pyrrolidone, vinyl acetate-crotonic acid copolymer, and styrene-maleic acid copolymer.

The above hydrophilic resins are preferably subjected to crosslinking reaction and cured before use. Examples of crosslinking agents (a waterproofing agent) include glyoxal, aldehydes such as melamine-formaldehyde resins, and urea-formaldehyde resins, methylol compounds such as N-methylolurea, N-methylolmelamine, and methylolated polyamide resins, active vinyl compounds such as divinyl sulfone and bis(β-hydroxyethylsulfonate), epoxy compounds such as epichiorohydrin, polyethylene glycol diglycidyl ether, polyamide-polyamine-epichlorohydrin adducts, and polyamide-epichiorohydrin resins, ester compounds such as monochioroacetate and thioglycolate, polycarboxylic acids such as polyacrylic acid, methyl vinyl ether-maleic acid copolymers, boric acid, titanyl sulfate, inorganic crosslinking agents such as salts of Cu, Al, Sn, V and Cr, and modified polyamide-polyimide resins can be exemplified.

In addition, crosslinking catalysts such as ammonium chloride, a silane coupling agent, and a titanate coupling agent can be used in combination.

Inorganic matrices formed by sol/gel conversion are preferably used as the inorganic high molecular weight compound. The sol/gel convertible systems which are preferably applied to the present invention are polymers wherein the bonding groups of polyvalent elements form a network structure via oxygen atoms and, at the same time, polyvalent metals also have unbonded hydroxyl groups and alkoxyl groups and they are mixed and form resinous structure. The systems are in a sol state when there are many alkoxyl groups and hydroxyl groups, and the network resinous structure comes to heighten with the progress of ether bonding.

In addition to the property that the degree of the hydrophilicity of the resinous structure varies, the sol/gel convertible systems according to the present invention also have the function of bonding a part of the hydroxyl groups to the solid fine particles to modify the surfaces of the solid fine particles, to thereby change the degree of the hydrophilicity. The polyvalent bonding elements of the compounds having hydroxyl groups and alkoxyl groups performing sol/gel conversion are aluminum, silicon, titanium and zirconium, all of which can be used in the present invention.

Of these resins, hydrophilic resins are particularly preferred as the exothermic layer from the viewpoint of adhesion with the image-recording layer.

As the light-to-heat convertible substances contained in the exothermic layer, metals, metallic oxide particles, pigment particles and dyes are preferred. Metals and metallic oxide particles which can be atomized and dispersed in the exothermic layer can be selected from Al, Si, Ti, V, Cr, Mn, Fe, Co, Ni, Cu, Zn, Y, Zr, Mo, Ag, Au, Pt, Pd, Rh, In, Sn and W.

Metallic fine particles of iron, silver, platinum, gold and palladium are particularly preferred.

Besides the above, $TiO_x$ (x is from 1.0 to 2.0), $SiO_x$ (x is from 0.6 to 2.0), $AlO_x$ (x is from 1.0 to 2.0), and a metallic azide compound such as the azide compounds of copper, silver and tin are also preferred.

Each of the above-described metallic oxides, metallic nitrides and metallic sulfides can be obtained by well-known methods. Many of these compounds are also commercially available by the names of titanium black, iron black, molybdenum red, emerald green, cadmium red, cobalt blue, prussian blue, and ultramarine.

In addition to the above metallic compounds and metals, nonmetal single particles such as carbon black, graphite, bone black, and various organic and inorganic pigments can also be contained in the exothermic layer as the light-to-heat convertible fine particles. Moreover, light-to-heat convertible dyes not in the form of particles can also be added to the resin layers.

The content of the light-to-heat converting agent in the exothermic layer is from 2 to 95 wt % based on the solid components. If the content is less than 2 wt %, the amount of heat generation is short and the sensitivity lowers and if the content is more than 90 wt %, the film strength is reduced.

Dye

Light-to-heat convertible dyes may be added to the exothermic layer alone or in combination with the above-described other light-to-heat converting agents. The dyes which can be used as the light-to-heat converting agent in the present invention are dyes which have light absorption range in the spectral wavelength region of the irradiated light, have light absorption range in the spectral wavelength regions of the solid fine particle pigments dispersible in the binder resin and the irradiated light, in addition, have dyeing property to the binder resin or have non-dyeing property but molecular dispersion property to the binder resin. Preferred solid fine particle dyes having dyeing property and molecular dispersion property are IR (infrared ray) absorbers, specifically dyes selected from a polymethine dye, a cyanine dye, a squarylium dye, a pyrylium dye, a diiummonium dye, a phthalocyanine compound, a triarylmethane dye, and a metallic dithiolene. More preferred of these are a polymethine dye, a cyanine dye, a squarylium dye, a pyrylium dye, a diimmonium dye, and a phthalocyanine compound. A polymethine dye, a cyanine dye and a phthalocyanine compound are most preferred from the viewpoint of synthesis aptitude. These dyes may be water-soluble dyes having a water-soluble group in the molecule.

As the preferred water-soluble groups, a sulfonic acid group, a carboxyl group and a phosphonic acid group can be exemplified.

Specific examples of the dyes (IR absorbers) for use in the exothermic layer as the light-to-heat converting agent are shown below, but the present invention is not limited thereto.

(1)

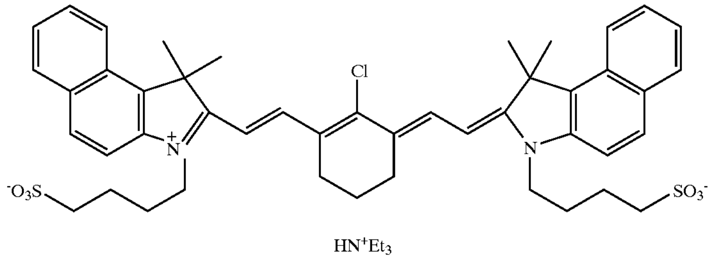

(2)

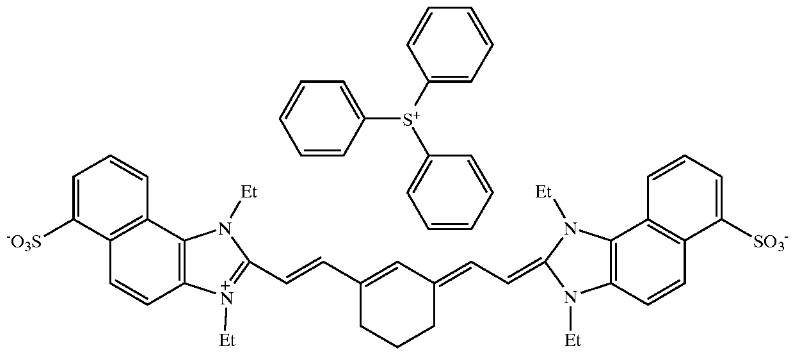

(3)

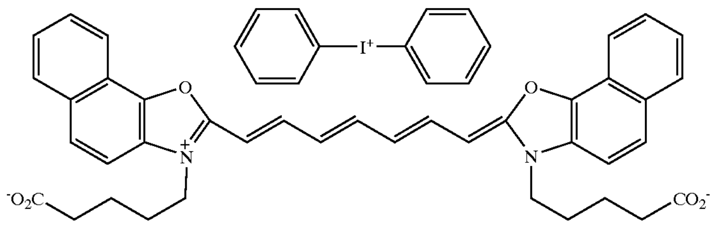

-continued
(4)
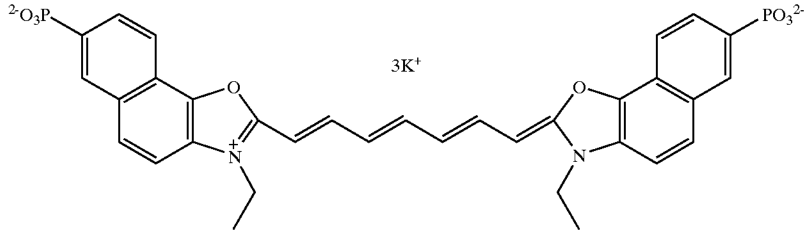
(5)
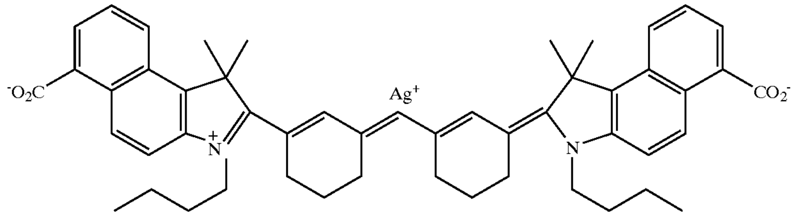
(6)
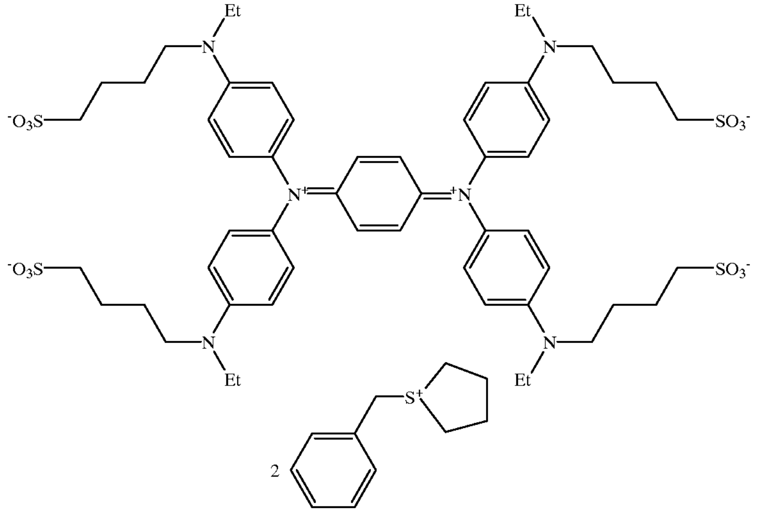
(7)
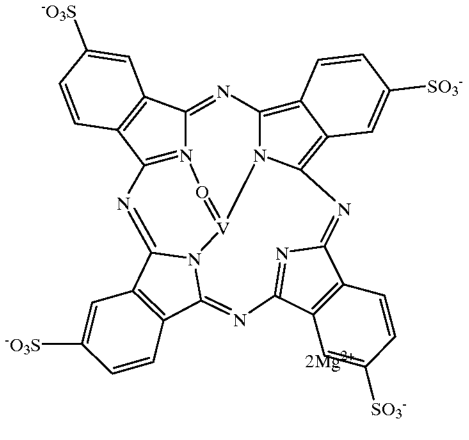

-continued (8)

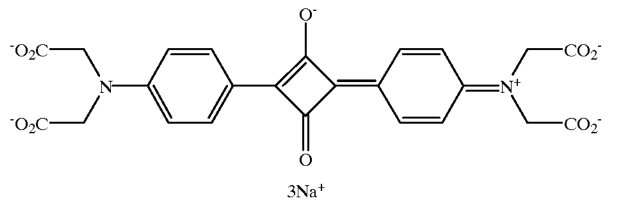

(9)

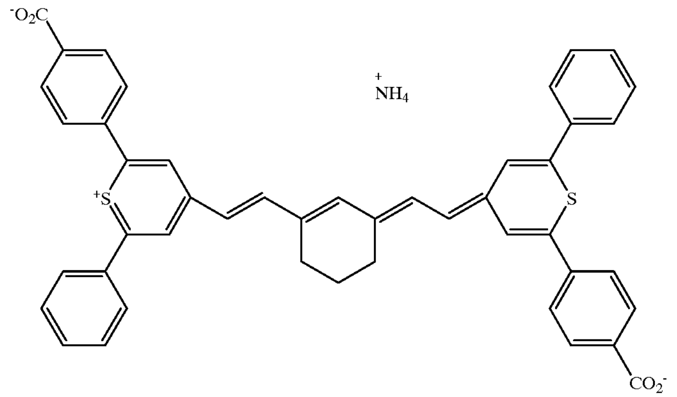

(10)

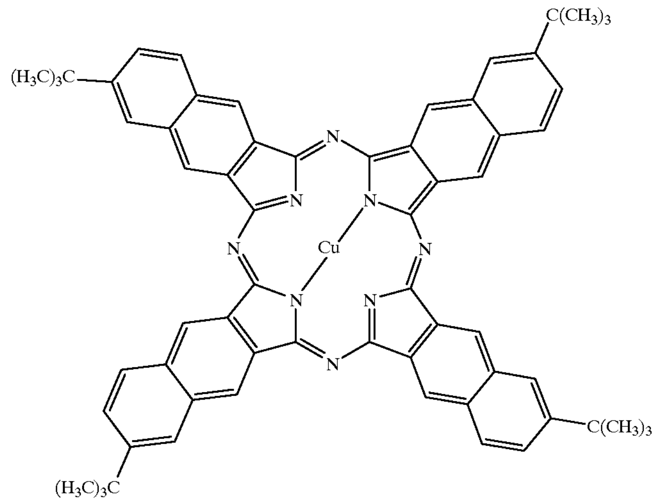

The content of these infrared absorbers is 1 wt % or more, preferably 2 wt % or more, and more preferably 5 wt % or more, based on the entire solids content in the exothermic layer. If the content of the infrared absorbers is less than 1 wt %, the sensitivity lowers. The upper limit of the addition amount is not restricted so long as the infrared absorbers are stably dispersed in the binder but the upper limit is 95 wt %, preferably 50 wt %, based on the entire solids content.

Besides the above-described resins and light-to-heat converting agents, the exothermic layer can contain various compounds for the purpose of improving the physical strength of the exothermic layer, improving the mutual dispersibility of the compositions constituting the layer, improving the coating properties, and improving the adhesion property with the hydrophilic layer. As such additives, the following compounds can be exemplified.

Inorganic Fine Particles

The same inorganic fine particles as those described above which are added to the image-recording layer can be used in the exothermic layer and the same effects can be obtained.

The amount of the inorganic fine particles added to the exothermic layer is the same range as in the inorganic fine particles for the image-recording layer.

When these inorganic fine particles are added to the exothermic layer, particularly the content is preferably from 1.0 to 70 wt %, preferably from 5.0 to 50 wt %, based on the solid constitutional components.

Surfactant

Additives which are added to the image-recording layer as described above can also be added to the exothermic layer, and the addition amount is also the same range as in the case of the image-recording layer.

Water-soluble Protective Layer

Since the surface of the lithographic printing plate precursor according to the present invention is hydrophilic, the water-soluble protective layer functions as the surface protective layer and prevents the printing plate precursor from becoming hydrophobic by the atmospheric influences of the environment when the printing plate precursor is transported as a product, stored, or handled before use, from being affected by temperature and humidity, from being damaged mechanically or from staining.

Figure 3:
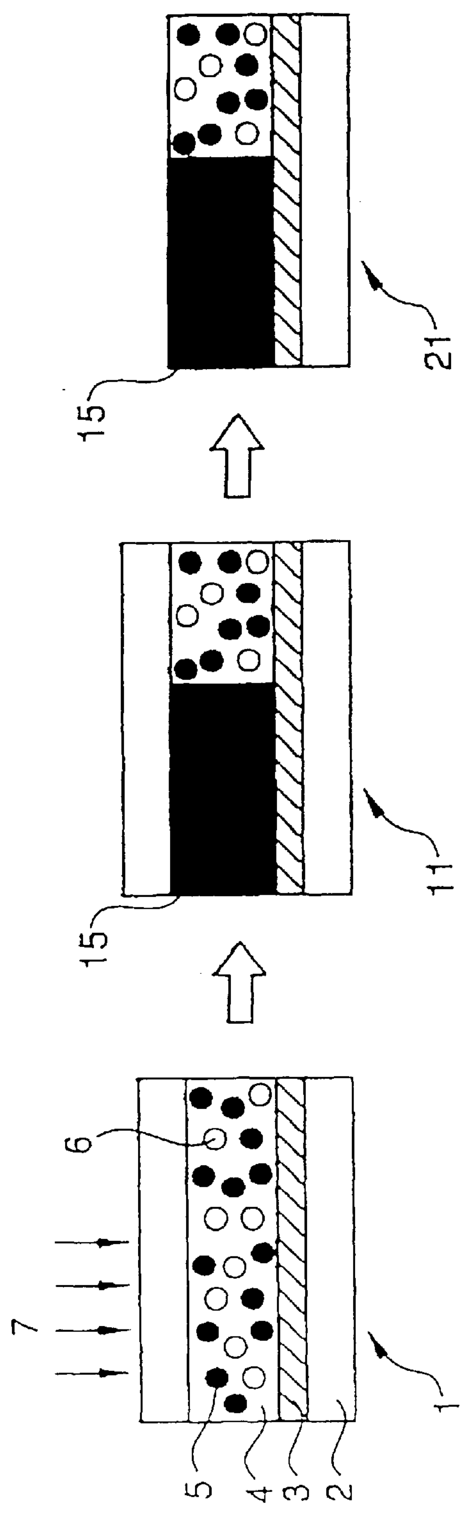
FIG. 3 is a drawing showing a cross-sectional view of a lithographic printing plate precursor having a water-soluble layer according to one embodiment of the present invention and a plate-making process using the same.

FIG. 3 is a drawing showing a cross-sectional view of a lithographic printing plate precursor having a water-soluble layer according to one embodiment of the present invention and a plate-making process using the precursor. In FIG. 3, each symbol showing each constitutional member indicates the same meaning as in FIG. 2. In symbol 1 on the left side of FIG. 3, a protective layer is provided on photosensitive layer (image-recording layer) 4. In symbol 11 on the central part of FIG. 3 showing the state of the printing plate precursor after being irradiated with light, hydrophobic region 15 is formed due to the fusion of metallic fine particles 5 by heat, which shows that there is no change on the protective layer. In symbol 21 on the right side showing the stage of printing, the protective layer has been vanished in a fountain solution.

Since the water-soluble protective layer is dissolved in a fountain solution and washed away at the initial stage of printing, additional work of the removal is not necessary, and printing suffers no hindrance.

The components contained in the water-soluble protective layer are described below.

Water-soluble High Molecular Weight Compound

Water-soluble high molecular weight compounds to be contained in the water-soluble protective layer function as water-soluble binder resin. Examples of water-soluble high molecular weight compounds include high molecular weight compounds sufficiently having groups, e.g., a hydroxyl group, a carboxyl group, and a basic nitrogen-containing group.

Specific examples of water-soluble high polymers include polyvinyl alcohol (PVA), modified PVA such as carboxyl-modified PVA, gum arabic, polyacrylamide and copolymer thereof, acrylic acid copolymer, vinyl methyl ether/maleic anhydride copolymer, vinyl acetate/maleic anhydride copolymer, styrene/maleic anhydride copolymer, roasted dextrin, oxygen-decomposed dextrin, enzyme-decomposed etherified dextrin, starch and derivatives thereof, cellulose derivatives such as carboxymethyl cellulose, carboxyethyl cellulose, methyl cellulose, and hydroxyethyl cellulose, casein, gelatin, polyvinyl pyrrolidone, vinyl acetate-crotonic acid copolymer, styrene-maleic acid copolymer, alginic acid and alkali metal salts thereof, alkaline earth metal salts or ammonium salts, polyacrylic acid, poly(ethylene oxide), water-soluble urethane resin, water-soluble polyester resin, polyhydroxyethyl acrylate, polyethylene glycol, polypropylene glycol, and N-vinylcarboxylic acid amide polymer.

Of these, polyvinyl alcohol (PVA), modified PVA such as carboxyl-modified PVA, gum arabic, polyacrylamide, polyacrylic acid, acrylic acid copolymer, polyvinyl pyrrolidone, and alginic acid and alkali metal salts thereof are preferably used.

The content of these water-soluble resins in a coating solution is generally from 3 to 25 wt %, preferably from 10 to 25 wt %.

Two or more of these water-soluble resins may be used as a mixture in the present invention.

Other Components of Water-soluble Protective Layer

The coating solution of the water-soluble protective layer may contain various surfactants. Examples of such surfactants include anionic surfactants and nonionic surfactants. Specific examples of anionic surfactants include aliphatic alcohol sulfates, tartaric acid, malic acid, lactic acid, levulinic acid, and organic sulfonic acid, and nitric acid, sulfuric acid and phosphoric acid are useful a mineral acid. At least one or more inorganic acid, organic acid and inorganic salt may be used in combination.

The same surfactants as those for use in the image-recording layer described above may be used. The amount of surfactants is preferably from 0.01 to 1 wt %, more preferably from 0.05 to 0.5 wt %, based on the entire solids content of the water-soluble layer.

Besides the above components, if necessary, lower polyhydric alcohols such as glycerol, ethylene glycol, and triethylene glycol can be used as wetting agent. The use amount of these wetting agents is generally from 0.1 to 5.0 wt %, preferably from 0.5 to 3.0 wt %, in the surface protective layer. In addition to the above components, a preservative (e.g., benzoic acid and the derivatives thereof, phenol, formaldehyde, and sodium dehydroacetate) can be added to the coating solution of the surface protective layer of the lithographic printing plate precursor of the present invention. Antiseptics can be added in the range of from 0.005 to 2.0 wt %.

A defoaming agent can be added to the coating solution of the surface protective layer of the lithographic printing plate precursor of the present invention. Organic silicone compounds can be used as the defoaming agent and the addition amount is preferably from 0.0001 to 0.1 wt %.

A light-to-heat converting agent may be added to the water-soluble protective layer. By the addition of a light-to-heat converting agent, an effective result can be obtained such that the sensitivity of the heat fusion of the metallic fine particles of the image-recording layer by light irradiation is further enhanced. The light-to-heat converting agent which may be added to the exothermic layer as described above may be used in the water-soluble protective layer in the same use range.

Coating

Each coating solution of the image-recording layer, the exothermic layer and the protective layer prepared by mixing the above-described constitutional components is coated on a support by any of the well-known coating methods and dried, thus each coated layer is obtained.

The coating method can be selected from the following well-known methods, e.g., bar coater coating, rotary coating, spray coating, curtain coating, dip coating, air knife coating, blade coating, roll coating, etc.

The image-recording layer of the lithographic printing plate precursor according to the present invention can contain surfactants, e.g., the above-described various kinds of surfactants for improving coating property. The addition amount of the surfactant as a coating aid is preferably from 0.01 to 1 wt %, more preferably from 0.05 to 0.5 wt %, based on the total solids content in the image-recording layer.

The dry coating amount of the image-recording layer (solids content) is varied according to the purpose but in the general lithographic printing plate precursor, it is preferably from 0.1 to 30 g/$m^2$, more preferably from 0.3 to 10 g/$m^2$.

The coating amount (solids content) of the exothermic layer is also varied according to the constitution but in the general lithographic printing plate precursor, it is preferably from 0.1 to 10 g/$m^2$, more preferably from 0.3 to 5 g/$m^2$.

The coating amount (solids content) of the protective layer is also varied according to the constitution but in the general lithographic printing plate precursor, it is preferably from 0.1 to 5 g/$m^2$, more preferably from 0.2 to 3 g/$m^2$.

Coating is generally performed in order of the exothermic layer, the image-recording layer and the protective layer.

Treatment with Organic Sulfur Compound

When the image-recording layer of the lithographic printing plate precursor formed by the above coating step is treated with an organic sulfur compound having a hydrophilic group, e.g., a carboxyl group, a hydroxyl group, a sulfuric acid group, a sulfonic acid group, a sulfin group, a phosphoric acid group, a nitric acid group, or a halide group, and a metal-adsorbing group adsorptive onto silver halide described in $R^1$ in each of the following formula, the organic sulfur compound is adsorbed onto the metallic fine particles of the light-to-heat convertible substance contained in the image-recording layer, thereby the hydrophilic property of the image-recording layer is improved. Since the metallic fine particles are fused by heat and vanished due to imagewise irradiation, the function of the organic sulfur compound is also vanished. Thus, the irradiated area is hydrophobic similarly to the case of not performing the treatment with the organic sulfur compound. As a result, the difference between the non-irradiated area and the irradiated area becomes larger, hence the discriminability is further increased.

A preferred sulfur compound is represented by the following formula (A), (B), (C) or (D):

RSM (A)

RSR (B)

RSSR (C)

(D)

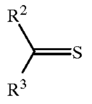

In formula (A), (B) and (C), M represents a hydrogen atom, an alkali metal atom, an alkaline earth metal atom, or an ammonium group; R represents $XnR^1$ (wherein X represents a water-soluble group selected from OH, $CO_2M$, $NH_2$, $SO_3M$, $SO_3M$, $SO_2M$, and an amino group, and M has the same meaning as above); n represents an integer of from 1 to 4; $R^1$ represents an alkyl, aryl, alkenyl, alkynyl, alkylamino or heterocyclic group, each of which has from 1 to 12, preferably from 1 to 8, carbon atoms, and substituted with the water-soluble group represented by $R^1$.

When $R^1$ represents a heterocyclic group, examples of preferred heterocyclic groups include an azole group, e.g., an imidazole group, an oxazole group, a thiazole group, a pyrazole group, an isothiazole group, an indazole group, a triazole group, a tetrazole group, a thiadiazole group, an imidazoline group, an oxazoline group, a thiazoline group, a pyrazoline group, an isothiazoline group, an indazoline group and a thiazolidine group, a pyrazyl group, a piperazyl group, a piperidyl group, a pyridazine group, a pyrrolo group, a pyridyl group, a morpholino group, and a thiazino group.

Further, an $R^1$ group may be substituted with an R' group, and the R' group has the same meaning as the $R^1$ group. Two $R^1$ groups may be bonded to form a ring. When a plurality of $R^1$ groups and R' groups are contained in the same molecule, a plurality of $R^1$ groups, a plurality of R' groups, and $R^1$ group and R' group may be the same or different with each other.

According to the above definition, two Rs in the same molecule in formulae (B) and (C) may be the same or different.

In formula (D), an $R^2$ group and an $R^3$ group are bonded to a thiocarbonyl group and each has the same meaning as R.

Further, in each of the above formula, when two or more R group, $R^2$ group and $R^3$ group are contained in the same molecule, they be the same or different.

Specific examples of the compounds represented by formula (A), (B), (C) or (D) are shown below.

M-1

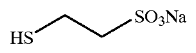

M-2

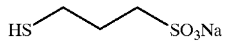

M-3

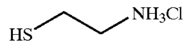

M-4

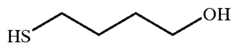

M-5

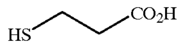

M-6

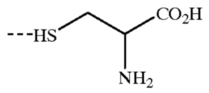

M-7

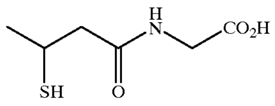

M-8

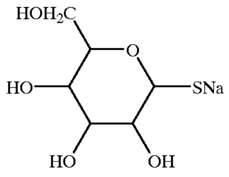

M-9

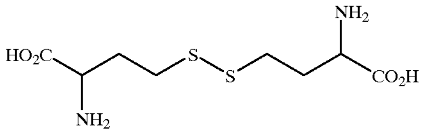

M-10

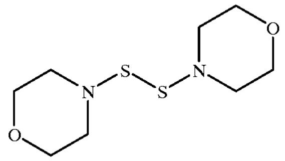

M-11

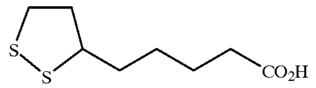

M-12

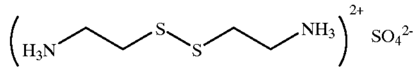

M-13

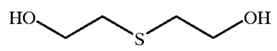

M-14

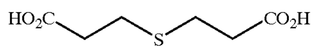

-continued
M-15
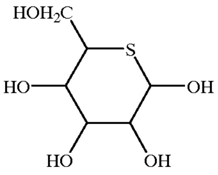
M-16
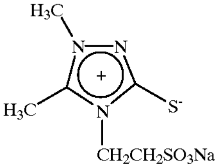
M-17
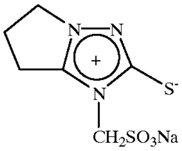
M-18
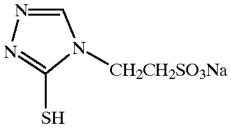
M-19
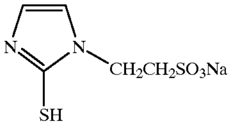
M-20
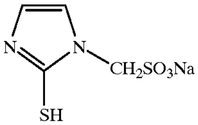
M-21
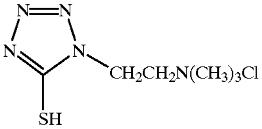
M-22
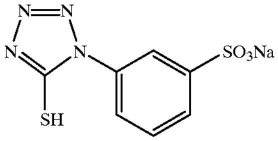
M-23
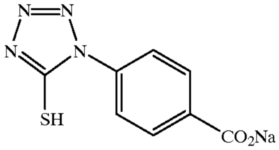
M-24
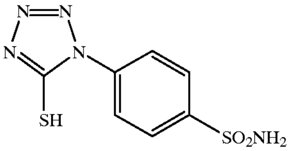
-continued
M-25
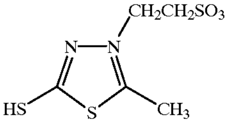
M-26
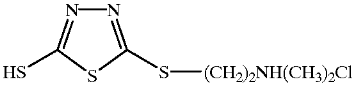
M-27
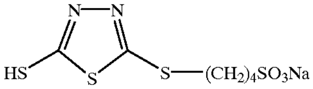
M-28
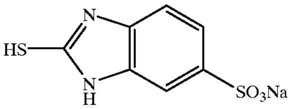
M-29
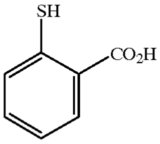
M-30
$HOCH_2CH_2SCH_2CH_2SCH_2CH_2OH$
M-31
$HOOCCH_2SCH_2CH_2SCH_2COOH$
M-32
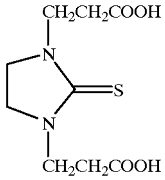
M-33
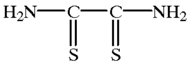
M-34
$H_2N—CSNHNHCS—NH_2$
M-35
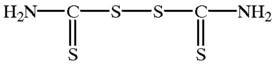
M-36
M-37
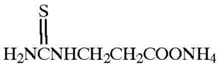
M-38
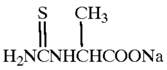
M-39
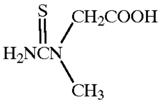

-continued

M-40

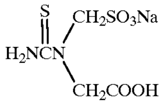

M-41

M-42

M-43

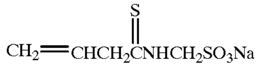

The treatment with the organic sulfur compound is performed by immersing the lithographic printing plate precursor in a solution containing the organic sulfur compound. The concentration lower than the solubility of the compound can be arbitrarily selected as the concentration of the organic sulfur compound in a solution containing the organic sulfur compound. The immersion is performed with an aqueous solution having the concentration of generally from $10^{-5}$ to $10^{1}$ mol/liter, preferably from $10^{-4}$ to $10^{0}$ mol/liter, more preferably from $10^{-3}$ to $10^{-1}$ mol/liter, from 30 seconds to 10 minutes or so, preferably from 30 seconds to 3 minutes or so. The temperature of the solution may be room temperature but hot solution may be used, and it is preferred to appropriately agitate the solution.

Water is generally used as the solvent of the organic sulfur compound, but an organic solvent miscible with water, e.g., methanol, ethanol or acetone, may be used.

Support

A support on which a coating solution for the image-recording layer is coated will be described below.

Supports which can be used in the present invention are plate-like materials having dimensional stability, and examples of supports include paper, paper laminated with plastics (e.g., polyethylene, polypropylene, polystyrene), a metal plate (e.g., aluminum, zinc, copper, nickel, stainless steel), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper or a plastic film laminated or deposited with the above metals.

Preferred supports are a polyester film, aluminum, an SUS plate not liable to be corrosive on a printing plate. Of these materials, an aluminum plate is particularly preferred because it is dimensionally stable and relatively inexpensive.

Preferred aluminum plates are a pure aluminum plate and an aluminum alloy plate comprising aluminum as a main component and a trace amount of foreign elements. A plastic film laminated or deposited with aluminum may also be used. Examples of foreign elements which may be contained in aluminum alloy include silicon, iron, manganese, copper, magnesium, chromium, zinc, bismuth, nickel, titanium, etc. The content of foreign elements in the aluminum alloy is 10% by weight or less. Particularly preferred aluminum for use in the present invention are pure aluminum but 100% pure aluminum is difficult to produce from the refining technique, accordingly an extremely small amount of foreign elements may be contained. The composition of aluminum plates used in the present invention are not specified, and conventionally well-known and commonly used aluminum materials can be used arbitrarily. A support for use in the present invention has a thickness of from about 0.05 to about 0.6 mm, preferably from 0.1 to 0.4 mm, and particularly preferably from 0.15 to 0.3 mm.

Prior to surface roughening of an aluminum plate, if desired, degreasing treatment for removing the rolling oil on the surface of the plate is conducted using a surfactant, an organic solvent or an alkaline aqueous solution, for example.

Surface roughening treatment of an aluminum plate can be performed by various methods, e.g., mechanical roughening, electrochemical roughening by dissolving the surface, and chemical roughening by selectively dissolving the surface. As mechanical roughening, well-known methods, e.g., a ball rubbing method, a brush abrading method, a blasting method, or a buffing method, can be used. As chemical roughening, a method of roughening the surface by immersing an aluminum plate in a saturated aqueous solution of the aluminum salt of a mineral acid as disclosed in JP-A-54-31187 is suitably used. As electrochemical roughening, a method of roughening the surface in a hydrochloric acid or nitric acid electrolyte by alternating current or direct current can be used. Further, electrolytic surface roughening using mixed acids can be used as disclosed in JP-A-54-63902.

Of these surface roughening methods, a roughening method using mechanical roughening and electrochemical roughening in combination as disclosed in JP-A-55-137993 is preferably used because the adhesion of a sensitizing image to a support is strong.

These roughening treatments are preferably performed so that the center line average surface roughness (Ra) of an aluminum plate becomes from 0.3 to 1.0 $\mu$m.

The thus surface-roughened aluminum plate is, if required, subjected to alkali etching treatment with an aqueous solution of potassium hydroxide or sodium hydroxide and neutralizing treatment and then to anodizing treatment to obtain desired abrasion resistance of the surface.

Various electrolytes for forming porous oxide film can be used in the anodizing treatment of an aluminum plate and, in general, sulfuric acid, hydrochloric acid, oxalic acid, chromic acid and mixed acids of these are used. The concentration of these electrolytes are arbitrarily determined according to the kinds of electrolytes.

Anodizing treatment conditions vary according to electrolytes used but in general appropriately the concentration of electrolyte is from 1 to 80 wt % solution, the liquid temperature is from 5 to 70° C., the electric current density is from 5 to 60 A/$dm^2$, the voltage is from 1 to 100 V, electrolytic time is from 10 seconds to 5 minutes.

The amount of the film oxide formed is preferably from 1.0 to 5.0 g/$m^2$, particularly preferably from 1.5 to 4.0 g/$m^2$. If the amount of the anodic oxide film is less than 1.0 g/$m^2$, the press life becomes insufficient and the film is easily scratched.

Of these anodizing treatments, the method of anodizing in sulfuric acid at high electric current density disclosed in British Patent 1,412,768 and the method of anodizing with phosphoric acid as electrolytic bath disclosed in U.S. Pat. No. 3,511,661 are preferred.

When the exothermic layer comprises resins having hydrophobicity, it is preferred to hydrophobitize the surface of the support. The hydrophobitizing treatment of the support surface is performed by coating an undercoating solution containing a silane coupling agent, or in some cases a titanium coupling agent, on the surface of the support. Silane coupling agents are generally represented by formula $(RO)_3SiR'$ (wherein R and R' each represents a substituted or unsubstituted alkyl group), RO group is hydrolyzed and becomes OH group, and is bonded to the surface of the support by ether bonding, while R' group provides a hydrophobic surface receiving ink.

Examples of silane coupling agents include γ-chloropropyltrimethoxysilane, vinyltrichlorosilane, vinyltriethoxysilane, vinyltris(β-methoxyethoxy)silane, γ-methacryloxypropyltrimethoxysilane, γ-glycosidoxypropyltrimethoxysilane, γ-aminopropyltriethoxysilane, γ-mercaptotrimethoxysilane, γ-ureidopropyltriethoxysilane, and N-(β-aminoethyl)-(β-aminopropyl)dimethoxysilane.

For securing adhesion with the image-recording layer, a plastic support is subjected to well-known electrostatic charge treatment before coating.

Plate-making Method

The plate-making method of this lithographic printing plate precursor will be described below. This lithographic printing plate precursor can be applied to light-to-heat converting type exposure such as a solid state laser or a semiconductor laser emitting infrared ray of the wavelength of from 760 to 1,200 nm, high intensity flash light such as a xenon electric discharge lamp, and infrared lamp exposure.

Writing of images may be any of exposure (e.g., areal exposure) system and scanning system. The former case is infrared ray irradiation system, or the system of irradiating the printing plate precursor with xenon electric discharge lamp of high intensity for a short time period and generating heat by light-to-heat conversion. When an areal exposure light source such as an infrared lamp is used, preferred exposure amount varies by the intensity but generally areal exposure intensity before being modulated by images for printing is preferably from 0.1 to 10 $J/cm^2$, more preferably from 0.1 to 1 $J/cm^2$. When a transparent support is used, exposure can be effected from the back side of the support through the support. It is preferred to select intensity of exposure so as to reach the above exposure intensity with the irradiation time of from 0.01 to 1 msec, preferably from 0.01 to 0.1 msec. When irradiation time is long, it is necessary to increase exposure intensity in the light of the competitive relationship between the generating rate of heat energy and diffusing rate of the generated heat energy.

In the latter case, scanning is performed on the printing plate precursor using laser light sources containing a large amount of infrared ray components with modulating the laser beams by printing image. Examples of laser light sources include a semiconductor laser, a helium-neon laser, a helium-cadmium laser, and a YAG laser. A laser light source having laser output of from 0.1 to 300 W can be used for irradiation. When a pulse laser is used, it is preferred to perform irradiation with laser beams having peak output of 1,000 W, preferably 2,000 W. In this case, exposure amount is preferably in areal exposure intensity before modulation by printing image of from 0.1 to 10 $J/cm^2$, preferably from 0.3 to 1 $J/cm^2$. When a transparent support is used, exposure can be effected from the back side of the support through the support.

A printing plate precursor which (i.e., a printing press) has been subjected to image exposure can be mounted on a printing machine and printing can be immediately performed. Alternatively, after installing a printing plate precursor on a printing machine, a printing plate can be formed on the machine by performing imagewise scanning exposure with laser beams. That is, in the plate-making method using the lithographic printing plate precursor according to the present invention, a lithographic printing plate can be made without going through development.

EXAMPLES

The present invention is specifically described below with referring to examples, but it should not be construed as the present invention is limited thereto.

Example I-1

Preparation of Hydrophilic Ag Colloid 1

One hundred (100) milliliters (30 wt %) of an aqueous solution of ferrous sulfate was added to 560 ml (32 wt %) of an aqueous solution of sodium citrate with stirring and mixed homogeneously. With vigorously stirring, 100 ml (10 wt %) of an aqueous solution of silver nitrate was added thereto within 30 seconds. After about 10 minutes, stirring was stopped.

Unnecessary salts in the obtained Ag colloid were removed by an ultrafilter with adding distilled water. Ultrafilter model CH2PRS (manufactured by Amicon Co., U.S.A.) and filter SIY30 (cutoff molecular weight: 30,000) were used. Washing was performed until electric conductivity reached 50 μs/cm. After water-washing, the concentration of Ag was adjusted to 6 wt %. This Ag colloid had an average particle size of 8 nm.

Example I-2

Preparation of Hydrophilic Ag Colloid 2

The silver concentration of Ag colloid prepared and washed in the same manner as in Example I-1, was adjusted to 6.9 wt %. Fifteen (15) milliliters (10 wt %) of an aqueous solution of mercapto compound M-2 was added to 100 ml of the above Ag colloid with stirring.

Example I-3

Preparation of Aluminum Support

A rolled plate having a thickness of 0.24 mm of JIS-A-105 aluminum containing 99.5 wt % of aluminum, 0.01 wt % of copper, 0.03 wt % of titanium, 0.3 wt % of iron, and 0.1 wt % of silicon was surface-grained using a 20 wt % aqueous suspension of 400 mesh pumice (manufactured by Kyoritsu Yogyo K. K.) and a rotary nylon brush (6,10-nylon), and then the plate was thoroughly washed with water.

The plate was immersed in a 10 wt % aqueous solution of sodium hydroxide and etched at 70° C. for 60 seconds, then washed with flowing water, further neutralized with a 20 wt % aqueous solution of nitric acid, and then cleaned by water-washing. Subsequently, the plate was subjected to electrolytic roughening treatment in a 1.0 wt % aqueous nitric acid solution (containing 0.5% of aluminum nitrate) using rectangular alternating wave form electric current of the anode time voltage of 12.7 V and the ratio of the quantity of electricity of the cathode time to the quantity of electricity of the anode time of 0.9, with the quantity of electricity of the anode time of 160 $coulomb/dm^2$. The surface roughness of the thus-obtained aluminum support was 0.6 μm (Ra).

After this treatment, the aluminum support was immersed in a 1 wt % aqueous solution of sodium hydroxide at 40° C. for 30 seconds to perform etching, and then washed with water. The plate was then immersed in a 30 wt % aqueous solution of sulfuric acid at 55° C. for 1 minute.

Further, the plate was subjected to anodization in a 20 wt % aqueous sulfuric acid solution (containing 0.8 wt % of aluminum) at 35° C. using direct current so as to obtain the anodic oxide film weight of 2.5 $g/dm^2$. The plate was then washed and dried to thereby prepare a support.

Preparation of Exothermic Layer

A coating solution having the following composition was prepared and coated on the above-prepared anodic oxide aluminum support, thereby an exothermic layer having a thickness of 1.0 g/m$^2$ was obtained.

| | |
|---|---|
| 10% MEK solution of butyral resin MB-S (manufactured by Sekisui Chemical Co., Ltd.) | 59 g |
| Carbon black dispersion (solids content: 21%) | 13.5 g |
| MEK (methyl ethyl ketone) | 62.7 g |

Coating of Image-recording Layer

An aqueous coating solution having the following composition was dispersed with a paint shaker for 10 minutes. The coating solution was coated on the above aluminum support with a bar coater in a dry film thickness of 3.0 g/m$^2$, and dried in an oven at 100° C. for 10 minutes.

Composition of Coating Solution for Image-recording Layer

| | |
|---|---|
| Titanium oxide powder (rutile type, average particle size: 0.2 μm, manufactured by Wako Pure Chemical Industries Ltd.) | 3.1 g |
| 10% Aqueous solution of PVA117 (manufactured by Kuraray Co., Ltd. ) | 3.5 g |
| 20% Aqueous solution of colloidal silica dispersion | 1.5 g |
| Aqueous solution of Ag colloid (6 wt %, prepared in Example I-1) | 15.0 g |
| Sol/gel adjusting solution | 2.4 g |
| Water | 7.7 g |

The sol/gel adjusting solution has the following composition.

Sol/gel Adjusting Solution (ripened at room temperature for 2 hours)

| | |
|---|---|
| Tetraethoxysilane | 15.0 g |
| Ethanol | 30.0 g |
| Aqueous solution of nitric acid (0.1 mol/liter) | 4.5 g |

The reflected optical density of the Ag colloid-containing printing plate precursor thus obtained was 1.17 (measured by a densitometer (X-RITE densitometer) having an optical system defined in ISO5 with a neutral color universal visible region filter was used).

The contact angle with water droplet of the surface of the thus-prepared printing plate precursor showed extended wetting, i.e., the hydrophilicity of the surface was remarkably high.

Image Formation

The printing plate precursor was subjected to exposure using PEARL setter 74 (manufactured by Presstek Co., Ltd.) as a laser beam scanning exposure apparatus. The surface of the exposed area was converted to an image-recording domain taking in the binder resin of the vicinity with the heat-fused silver as the main component. The contact angle with water droplet of the surface of the irradiated area of this printing plate was 63° and the surface was changed to highly hydrophobic. Plate-making was then performed without going through development.

Printing

Printing was performed using RYOBI-3200MCD printing machine. As the fountain solution, an aqueous solution of 1 vol % of EU-3 (manufactured by Fuji Photo Film Co., Ltd.) was used, and ink was GEOS (N) black.

In the first place, running-in was performed 30 revolutions with a fountain solution, then ink was fed and printing was started. Ten thousand (10,000) sheets of printed matters having no printing staining and high quality were obtained.

Comparative Example I-1

A printing plate was prepared in the same manner as in Example I-3 except that an image-recording layer was directly provided on an aluminum support without providing an exothermic layer. The contact angle with water droplet of the surface of the thus-prepared printing plate showed extended wetting, i.e., the hydrophilicity of the surface was remarkably high.

The contact angle with water droplet of the surface of the irradiated area of the printing plate obtained by imagewise irradiation on the same exposure amount condition as in Example I-3 was 24°, inking at initial stage of printing was insufficient and good printed matters could not be obtained.

Example I-4

A printing plate was prepared in the same manner as in Example I-3 except that the exothermic layer was replaced with the following composition.

| | |
|---|---|
| Methyl methacrylate/methacrylic acid copolymer (80/20 in molar ratio) | 47 g |
| Carbon black dispersion (solids content: 21%) | 100 g |
| Silica coupling agent (Saira Ace 510, manufactured by AZmax Co., Ltd.) | 4.7 g |
| MEK | 1,365.3 g |

Ten thousand (10,000) sheets of printed matters having no printing staining and high quality were obtained similarly to Example I-3.

Example I-5

A printing plate was prepared in the same manner as in Example I-3 except that the exothermic layer was replaced with the following composition.

| | |
|---|---|
| Urethane series latex 7X521 (manufactured by Kanebo Co., Ltd.) (solids content: 21%) | 35 g |
| Carbon black dispersion (solids content: 21%) | 39 g |
| Water | 103 g |

Ten thousand (10,000) sheets of printed matters having no printing staining and high quality were obtained similarly to Example I-3.

Example I-6

A printing plate was prepared in the same manner as in Example I-3 except that the exothermic layer was replaced with the following composition.

| | |
|---|---|
| 20% Aqueous solution of colloidal silica dispersion | 18.2 g |
| Dye (1) shown below (a 1 wt % aq. soln.) | 22 g |
| Sol/gel adjusting solution | 24 g |
| Water | 35.8 g |

(1)

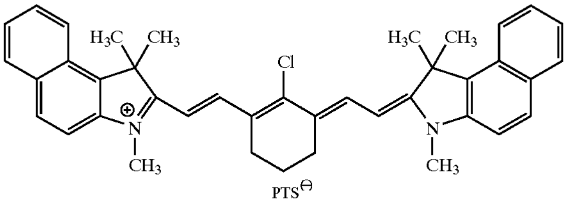

The same sol/gel adjusting solution as in Example I-3 was used.

Ten thousand (10,000) sheets of printed matters having no printing staining and high quality were obtained similarly to Example I-3.

Example I-7

A printing plate was prepared in the same manner as in Example I-3 except that the image-recording layer coating solution was prepared with the aqueous solution of Ag colloid prepared in Example I-2 (Ag concentration: 6.9 wt %).

Ten thousand (10,000) sheets of printed matters having no printing staining and high quality were obtained similarly to Example I-3.

Examples I-8 to I-13

Each printing plate was prepared in the same manner as in Example I-3 except that an image-recording layer-coating solution was prepared using the 6 wt % metallic colloid solution shown in Table I-1 in place of the 6 wt % Ag colloid solution prepared in Example I-3.

Metallic Colloid Dispersion:

Each metallic colloid dispersion was prepared by reducing the inorganic halo complex salt comprising each metal ion shown in Table I-1 with $NaBH_4$ using polyvinyl pyrrolidone (PVP) or polyvinyl alcohol (PVA) as a dispersant.

The contact angle with water droplet of the surface of each of the thus-prepared printing plates showed extended wetting, i.e., the hydrophilicity of the surface was remarkably high.

The contact angle with water droplet of the surface of the imagewise irradiated area of each of the above-obtained printing plate where metallic colloid was coagulated by heat was as shown in Table I-1. The inking was uniform, the background of the non-image area was not stained, and good printed matters could be obtained. Ten thousand (10,000) sheets of printed matters were further printed and high quality printed matters having no printing staining were obtained.

TABLE I-1

| Example No. | Metallic Colloid | Inorganic Salt | Dispersant | Average Diameter (nm) | Contact Angle with Water Droplet of Irradiated Area |
|---|---|---|---|---|---|
| Example I-8 | Au | Chloroauric acid | PVP | 5 | 65° |
| Example I-9 | Pt | Potassium platinum (II) chloride | PVP | 3 | 72° |
| Example I-10 | Pd | Sodium pallidium (II) chloride | PVA | 4 | 68° |
| Example I-11 | Ph | Ammonium rhodium hexachloride | PVA | 5 | 75° |
| Example I-12 | Ag/Pd | Silver nitrate/ sodium palladium (II) chloride | PVP | 7 | 69° |
| Example I-13 | Ag/Au | Silver nitrate/ chloroauric acid | PVP | 6 | 67° |

At the time of exposure, a neutral density plate having a transmission density of 0.3 was inserted between the light source and the printing plate precursor to reduce the exposure intensity to one half, and the above test was repeated. Changes were not observed in the surface contact angle and the obtained printed matters, thus it was confirmed that the latitude of exposure intensity was sufficient.

Examples I-14 to I-16

A printing plate was prepared in the same manner as in Example I-3 except that the sol/gel adjusting solution in the coating solution for the image-recording layer was prepared by replacing tetraethoxysilane with each silane coupling agent and additive shown in Table I-2 below.

The contact angle with water droplet of the surface of each of the thus-prepared printing plates showed extended wetting, i.e., the hydrophilicity of the surface was remarkably high.

The contact angle with water droplet of the surface of the imagewise irradiated area of each of the above-obtained printing plates where silver colloid was coagulated by heat was as shown in Table I-2. The inking was uniform, the background of the non-image area was not stained, and good printed matters could be obtained. Ten thousand (10,000) sheets of printed matters were further printed and high quality printed matters having no printing staining were obtained.

TABLE I-2

| Example No. | Silane Coupling Agent | Additive | Contact Angle with Water Droplet of Irradiated Area |
|---|---|---|---|
| Example I-14 | Aminopropylsilane triol | Nitric Acid | 85° |
| Example I-15 | Aminopropyltrimethoxy-silane | Nitric Acid | 83° |
| Example I-16 | Mercaptopropyl-trimethoxysilane | Silver Nitrate | 78° |

The lithographic printing plate precursor according to the present invention is capable of plate-making by heat mode image-recording, capable of mounting on a printing machine for plate-making with ease requiring no development, and also capable of image-recording by scanning exposure. The lithographic printing plate precursor of the present invention is excellent in press life and resistant to printing staining. In particular, according to scanning system image exposure by laser beams, plate-making is easily performed with high sensitivity and sufficiently wide latitude of exposure light amount, and the resulting printing plate is excellent in the discriminability of an image area and a non-image area.

Example II-1

Preparation of Hydrophilic Ag Colloid 1

One hundred (100) milliliters (30 wt %) of an aqueous solution of ferrous sulfate was added to 560 ml (32 wt %) of an aqueous solution of sodium citrate with stirring and mixed homogeneously. With vigorously stirring, 100 ml (10 wt %) of an aqueous solution of silver nitrate was added thereto within 30 seconds. After about 10 minutes, stirring was stopped.

Unnecessary salts in the obtained Ag colloid were removed by water-washing (ultrafiltration) by means of an ultrafilter. Ultrafilter model CH2PRS (manufactured by Amicon Co., U.S.A.) and filter SIY30 (cutoff molecular weight: 30,000) were used. Washing was performed until electric conductivity reached 50 μs/cm. After water-washing, the concentration of Ag was adjusted to 6 wt %. This Ag colloid had an average particle size of 8 nm.

Example II-2

Preparation of Hydrophilic Ag Colloid 2

The silver concentration of Ag colloid prepared and washed in the same manner as in Example II-1 was adjusted to 6.9 wt %. Fifteen (15) milliliters (10 wt %) of an aqueous solution of mercapto compound M-2 was added to 100 ml of the above Ag colloid with stirring.

Example II-3

Preparation of Aluminum Support

A rolled plate having a thickness of 0.24 mm of JIS-A-105 aluminum containing 99.5 wt % of aluminum, 0.01 wt % of copper, 0.03 wt % of titanium, 0.3 wt % of iron, and 0.1 wt % of silicon was surface-grained using a 20 wt % aqueous suspension of 400 mesh pumice (manufactured by Kyoritsu Yogyo K. K.) and a rotary nylon brush (6,10-nylon), and then the plate was thoroughly washed with water.

The plate was immersed in a 10 wt % aqueous solution of sodium hydroxide and etched at 70° C. for 60 seconds, then washed with flowing water, further neutralized with a 20 wt % aqueous solution of nitric acid, and then cleaned by water-washing. Subsequently, the plate was subjected to electrolytic roughening treatment in a 1.0 wt % aqueous nitric acid solution (containing 0.5% of aluminum nitrate) using rectangular alternating wave form electric current of the anode time voltage of 12.7 V and the ratio of the quantity of electricity of the cathode time to the quantity of electricity of the anode time of 0.9, with the quantity of electricity of the anode time of 160 coulomb/$dm^2$. The surface roughness of the thus-obtained aluminum support was 0.6 μm (Ra).

After this treatment, the aluminum support was immersed in a 1 wt % aqueous solution of sodium hydroxide at 40° C. for 30 seconds to perform etching, and then washed with water. The plate was then immersed in a 30 wt % aqueous solution of sulfuric acid at 55° C. for 1 minute.

Further, the plate was subjected to anodization in a 20 wt % aqueous sulfuric acid solution (containing 0.8 wt % of aluminum) at 35° C. using direct current so as to obtain the anodic oxide film weight of 2.5 g/$dm^2$. The plate was then washed and dried to thereby prepare a support.

Preparation of Exothermic Layer

A coating solution having the following composition was prepared and coated on the above-prepared anodic oxide aluminum support, thereby an exothermic layer having a thickness of 1.0 g/$m^2$ was obtained.

| | |
|---|---|
| 10% MEK solution of butyral resin MB-S (manufactured by Sekisui Chemical Co., Ltd.) | 59 g |
| Carbon black dispersion (solids content: 21%) | 13.5 g |
| MEK (methyl ethyl ketone) | 62.7 g |

Hydrophobitization Precursor A: Composite Particle 1 having Hetero Coagulation Surface Layer Into a three neck flask were added 70 g of styrene, 30 g of trimethoxysilylpropylmethacrylate, 200 g of water, and 10 g of surfactant XL-102F (manufactured by Lion Co., Ltd. (a 4.7% aq. soln.)), and the temperature was raised to 80° C. while introducing nitrogen. Thereafter, the content of the flask was stirred for about 30 minutes, then 1 g of $K_2S_2O_8$ was added thereto and emulsification polymerization was conducted at 80° C. for 6 hours, thus resin particles having a particle size of about 0.1 μm were obtained. Further, 30 g of Snowtex C (manufactured by Nissan Chemical Industries, Ltd.) was added to the above resin particle dispersion solution. Thus hydrophobitization precursor A (composite particles 1) having a particle size of 0.15 μm and having hetero-coagulated hydrophilic surface layer comprising resin core and silica layer shell, where silica sol fine particles were hetero-coagulated on the surfaces of resin particles, was produced.

Coating of Image-recording Layer

An aqueous coating solution having the following composition was dispersed with a paint shaker for 10 minutes. The coating solution was coated on the above aluminum support with a bar coater in a dry film thickness of 3.0 g/$m^2$, and dried in an oven at 100° C. for 10 minutes.

Composition of Coating Solution for Image-Recording Layer

| | |
|---|---|
| Titanium oxide powder (rutile type, average particle size: 0.2 μm, manufactured by Wako Pure Chemical Industries Ltd.) | 20 g |
| 5% Aqueous solution of PVA117 (manufactured by Kuraray Co., Ltd. ) | 70 g |
| 20% Aqueous solution of colloidal silica dispersion | 60 g |
| Aqueous solution of Ag colloid (6 wt %, prepared in Example II-1) | 150 g |
| Sol/gel adjusting solution | 28 g |
| Fine particles of hydrophobitization precursor A (32 wt % aqueous dispersion) | 34 g |
| Water | 20 g |

The sol/gel adjusting solution has the following composition.

Sol/Gel Adjusting Solution (ripened at room temperature for 2 hours)

| | |
|---|---|
| Tetraethoxysilane | 15.0 g |
| Ethanol | 30.0 g |
| Aqueous solution of nitric acid (0.1 mol/liter) | 4.5 g |

The contact angle with water droplet of the surface of the thus-prepared printing plate precursor showed extended wetting, i.e., the hydrophilicity of the surface was remarkably high.

Image Formation

The printing plate precursor was subjected to exposure using PEARL setter 74 (manufactured by Presstek Co., Ltd.) as a laser beam scanning exposure apparatus. The surface of the exposed area was converted to an image-recording domain taking in the binder resin of the vicinity with the heat-fused silver as the main component. The contact angle with water droplet of the surface of the irradiated area of this printing plate was 1050 and the surface was changed to highly hydrophobic. Plate-making was then performed without going through development.

Printing

Printing was performed using RYOBI-3200MCD printing machine. As the fountain solution, an aqueous solution of 1 vol % of EU-3 (manufactured by Fuji Photo Film Co., Ltd.) was used, and ink was GEOS (N) black.

In the first place, running-in was performed 30 revolutions with a fountain solution, then ink was fed and printing was started. Ten thousand (10,000) sheets of printed matters having no printing staining and high quality were obtained.

Comparative Example II-1

A lithographic printing plate precursor was prepared in the same manner as in Example II-3 except that an aqueous dispersion of carbon black (average particle size: 0.07 μm, a 20 wt % aq. soln.) was used as the light-to-heat converting agent in place of Ag colloid aqueous solution (6 wt %) used in the coating solution for image-recording layer.

The contact angle with water droplet of the surface of the thus-prepared printing plate precursor was 25°, i.e., the hydrophilicity of the surface was inferior.

The contact angle with water droplet of the surface of the imagewise irradiated area of the printing plate was 95° and the inking at initial time of printing was uniform, but the image area was abraded and inking failure occurred after 1,000 sheets had been printed. The background of the non-image area was stained from the start of printing, and good printed matters could not be obtained.

Comparative Example II-2

A printing plate was prepared in the same manner as in Example II-3 except that an image-recording layer was directly provided on an aluminum support without providing an exothermic layer.

The contact angle with water droplet of the surface of the thus-prepared printing plate showed extended wetting, i.e., the hydrophilicity of the surface was remarkably high.

The contact angle with water droplet of the surface of the irradiated area of the printing plate obtained by imagewise irradiation on the same exposure amount condition as in Example II-3 was 30°, inking at initial stage of printing was insufficient and good printed matters could not be obtained.

Example II-4

A printing plate was prepared in the same manner as in Example II-3 except that the exothermic layer was replaced with the following composition.

| | |
|---|---|
| Methyl methacrylate/methacrylic acid copolymer (80/20 in molar ratio) | 47 g |
| Carbon black dispersion (solids content: 21%) | 100 g |

-continued

| | |
|---|---|
| Silica coupling agent (Saira Ace 510, manufactured by AZmax Co., Ltd.) | 4.7 g |
| MEK | 1,365.3 g |

Ten thousand (10,000) sheets of printed matters having no printing staining and high quality were obtained similarly to Example II-3.

Example II-5

A printing plate was prepared in the same manner as in Example II-3 except that the exothermic layer was replaced with the following composition.

| | |
|---|---|
| Urethane series latex 7X521 (manufactured by Kanebo Co., Ltd.) (solids content: 21%) | 35 g |
| Carbon black dispersion (solids content: 21%) | 39 g |
| Water | 103 g |

Ten thousand (10,000) sheets of printed matters having no printing staining and high quality were obtained similarly to Example II-3.

Example II-6

A printing plate was prepared in the same manner as in Example II-3 except that the exothermic layer was replaced with the following composition.

| | |
|---|---|
| 20% Aqueous solution of colloidal silica dispersion | 18.2 g |
| Dye (1) shown below (a 1 wt % aq. soln.) | 22 g |
| Sol/gel adjusting solution | 24 g |
| Water | 35.8 g |

(1)

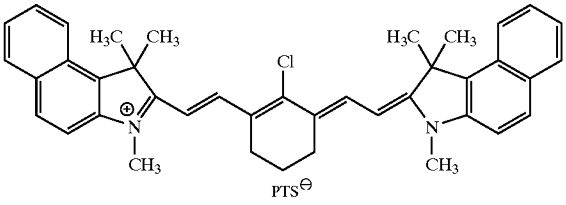

The same sol/gel adjusting solution as in Example II-3 was used.

Ten thousand (10,000) sheets of printed matters having no printing staining and high quality were obtained similarly to Example II-3.

Example II-7

A printing plate was prepared in the same manner as in Example II-3 except that the image-recording layer coating solution was prepared with the aqueous solution of Ag colloid prepared in Example II-2 (Ag concentration: 6.9 wt %).

Ten thousand (10,000) sheets of printed matters having no printing staining and high quality were obtained similarly to Example II-3.

Examples II-8 to II-13

Each printing plate was prepared in the same manner as in Example II-3 except that an image-recording layer coating solution was prepared using the 6 wt % metallic colloid solution shown in Table II-1 in place of the 6 wt % Ag colloid solution prepared in Example II-3.

Metallic Colloid Dispersion:

Each metallic colloid dispersion was prepared by reducing the inorganic halo complex salt comprising each metal ion shown in Table II-1 with $NaBH_4$ using polyvinyl pyrrolidone (PVP) or polyvinyl alcohol (PVA) as a dispersant.

The contact angle with water droplet of the surface of each of the thus-prepared printing plates showed extended wetting, i.e., the hydrophilicity of the surface was remarkably high.

The contact angle with water droplet of the surface of the imagewise irradiated area of each of the above-obtained printing plate where metallic colloid and polystyrene fine particles were coagulated by heat was as shown in Table II-1. The inking was uniform, the background of the non-image area was not stained, and good printed matters could be obtained. Ten thousand (10,000) sheets of printed matters were further printed and high quality printed matters having no printing staining were obtained.

TABLE II-1

| Example No. | Metallic Colloid | Inorganic Salt | Dispersant | Average Diameter (nm) | Contact Angle with Water Droplet of Irradiated Area |
|---|---|---|---|---|---|
| Example II-8 | Au | Chloroauric acid | PVP | 5 | 65° |
| Example II-9 | Pt | Potassium platinum(II) chloride | PVP | 3 | 72° |
| Example II-10 | Pd | Sodium palladium(II) chloride | PVA | 4 | 68° |
| Example II-11 | Rh | Ammonium rhodium hexachloride | PVA | 5 | 75° |
| Example II-12 | Ag/Pd | Silver nitrate/sodium palladium(II) chloride | PVP | 7 | 69° |
| Example II-13 | Ag/Pt | Silver nitrate/potassium platinum (II) chloride | PVP | 6 | 67° |

stained from the start of printing, and good printed matters could not be obtained in both Reference Examples 1 and 2.

Hydrophobitization Precursor B: Composite Particle 2 having Hetero Coagulation Surface Layer Into a three neck flask were added 60 g of styrene, 10 g of divinylbenzene, 30 g of trimethoxysilylpropyl methacrylate, 200 g of water, and 10 g of surfactant XL-102F (manufactured by Lion Co., Ltd. (a 4.7% aq. soln.)), and the temperature was raised to 80° C. while introducing nitrogen. Thereafter, the content of the flask was stirred for about 30 minutes, then 1 g of $K_2S_2O_8$ was added thereto and emulsification polymerization was conducted at 80° C. for 6 hours, thus resin particles having particle sizes of about 0.2 μm were obtained. Further, 30 g of Snowtex C (manufactured by Nissan Chemical Industries, Ltd.) was added to the above resin particle dispersion solution. Thus hydrophobitization precursor B (composite particles 2) having a particle size of 0.25 μm and having hetero-coagulated hydrophilic surface layer comprising resin core and silica layer shell, where silica sol fine particles were hetero-coagulated on the surfaces of resin particles, was produced.

Examples II-14 to II-23

Each printing plate was prepared in the same manner as in Example II-3 except that each hydrophobitization precursor shown below was used in place of the hydrophobitization precursor A fine particles used in the coating solution for the image-recording layer.

The contact angle with water droplet of the surface of each of the thus-prepared printing plates showed extended wetting, i.e., the hydrophilicity of the surface was remarkably high.

The contact angle with water droplet of the surface of the imagewise irradiated area of each of the above-obtained printing plates formed by heat coagulation was as shown in Table II-2. The inking property was uniform, the background of the non-image area was not stained, and good printed matters could be obtained. Ten thousand (10,000) sheets of printed matters were further printed and high quality printed matters having no printing staining were obtained.

On the other hand, in Reference Examples 1 and 2, the contact angle with water droplet of the surface of each printing plate precursor, where the lithographic printing precursors were prepared with resin particle dispersions not subjected to surface hydrophilization treatment, were 20° and 15° respectively, i.e., the hydrophilicity of the each surface was a little inferior.

The contact angles with water droplets of the surfaces of the imagewise irradiated areas of the printing plates were 110° and 103°, and the inking at initial time of printing was uniform, but the background of the non-image area was Hydrophobitization Precursor C: Composite Particle 3 having Hetero Coagulation Surface Layer Into a three neck flask were added 70 g of styrene, 30 g of trimethoxysilylpropyl methacrylate, 200 g of water, and 10 g of surfactant XL-102F (manufactured by Lion Co., Ltd. (a 4.7% aq. soln.)), and the temperature was raised to 80° C. while introducing nitrogen. Thereafter, the content of the flask was stirred for about 30 minutes, then 1 g of $K_2S_2O_8$ was added thereto and emulsification polymerization was conducted at 80° C. for 6 hours, thus resin particles having particle sizes of about 0.1 μm were obtained. Further, 30 g of alumina sol (manufactured by Nissan Chemical Industries, Ltd.) was added to the above resin particle dispersion solution. Thus hydrophobitization precursor C (composite particles 3) having a particle size of 0.15 μm and having hetero-coagulated hydrophilic surface layer comprising resin core and alumina shell, where alumina sol fine particles were hetero-coagulated on the surfaces of resin particles, was produced.

Hydrophobitization Precursor D: Composite Particle 1 having Hetero Phase Surface Into a three neck flask were added 70 g of styrene, 30 g of trimethoxysilylpropyl methacrylate, 200 g of water, and 10 g of surfactant XL-102F (manufactured by Lion Co., Ltd. (a 4.7% aq. soln.)), and the temperature was raised to 80° C. while introducing nitrogen. Thereafter, the content of the flask was stirred for about 30 minutes, then 1 g of $K_2S_2O_8$ was added thereto and emulsification polymerization was conducted at 80° C. for 6 hours, thus resin particles having particle sizes of about 0.1 μm were obtained. Further, 30 g of tetraethoxysilane (manufactured by Shin-Etsu Chemical Co., Ltd.) was added to the above resin particle dispersion solution, sol/gel reaction was performed at room temperature, thereby the surfaces of resin particles were coated with silica. Thus hydrophobitization precursor D (composite particle 1) having a particle size of 0.15 μm and having a hydrophilic gel surface layer comprising resin core and silica layer shell was produced.

Hydrophobitization Precursor E: Composite Particle 2 having Hetero Phase Surface Into a three neck flask were added 60 g of styrene, 10 g of divinylbenzene, 30 g of hydroxyethyl methacrylate, 200 g of water, and 10 g of surfactant XL-102F (manufactured by Lion Co., Ltd. (a 4.7% aq. soln.)), and the temperature was raised to 80° C. while introducing nitrogen. Thereafter, the content of the flask was stirred for about 30 minutes, then 1 g of $2S_2O_8$ was added thereto and emulsification polymerization was conducted, thus resin particles having particle sizes of about 0.2 μm were obtained. Further, 30 g of tetraethoxysilane (manufactured by Shin-Etsu Chemical Co., Ltd.) was added to the above resin particle dispersion solution, sol/gel reaction was performed at room temperature, thereby the surfaces of resin particles were coated with silica. Thus hydrophobitization precursor E (composite particle 2) having a particle size of 0.25 μm and having a hydrophilic gel surface layer comprising resin core and silica layer shell was produced.

Hydrophobitization Precursor F: Core/shell Particle 1

Into a three neck flask were added 80 g of styrene, 10 g of divinylbenzene, 10 g of Macromonomer AA-6 (dispersant, manufactured by Toa Gosei Co., Ltd.), and 400 g of MEK, and the temperature was raised to 75° C. while introducing nitrogen. Thereafter, the content of the flask was stirred for about 30 minutes, then 2 g of azoisobutyronitrile was added thereto and dispersion polymerization was conducted at 75° C. for 6 hours, thus resin particles having particle sizes of 0.2 μm were obtained. Further, the temperature of the resin particle dispersion solution was raised to 75° C. while introducing nitrogen. After stirring the dispersion solution for about 30 minutes, 35 g of acrylamide, 4 g of methylenebisacrylamide, and 1 g of azoisobutyronitrile were dissolved in 100 g of MEK and this solution was dropwise added to the flask over about 2 hours, and then the reaction solution was seed dispersion polymerized for 3 hours. Thus hydrophobitization precursor F (core/shell particle 1) having a particle size of 0.3 μm and having crosslinked styrene core and acrylamide shell was produced.

Hydrophobitization Precursor G: Core/shell Particle 2

Into a three neck flask were added 80 g of styrene, 10 g of divinylbenzene, 10 g of Macromonomer AA-6 (dispersant, manufactured by Toa Gosei Co., Ltd.), and 400 g of MEK, and the temperature was raised to 75° C. while introducing nitrogen. Thereafter, the content of the flask was stirred for about 30 minutes, then 2 g of azoisobutyronitrile was added thereto and dispersion polymerization was conducted at 75° C. for 6 hours, thus resin particles having particle sizes of 0.2 μm were obtained. Further, the temperature of the resin particle dispersion solution was raised to 75° C. while introducing nitrogen. After stirring the dispersion solution for about 30 minutes, 35 g of acrylic acid, 4 g of ethylene glycol diacrylate, and 1 g of azoisobutyronitrile were dissolved in 100 g of MEK and this solution was dropwise added to the flask over about 2 hours, and then the reaction solution was seed dispersion polymerized for 3 hours. Thus hydrophobitization precursor G (core/shell particle 2) whose core comprised crosslinked styrene and shell comprised acrylamide and having a particle size of 0.3 μm was produced. pH of the core/shell particle 2 was adjusted to 10 or more with sodium hydroxide, thus core/shell particles in which the carboxyl group of the acrylic acid was converted to sodium salt were obtained.

Hydrophobitization Precursor H: Microencapsulated Particle 1

Ethyl acetate 19.0 parts (hereinafter parts means parts by weight), 5.9 parts of isopropylphenyl, 5 parts of glycerol laurate and 2.5 parts of tricresyl phosphate were heated and mixed homogeneously. As the capsule wall material (hydrophobitization precursor at the same time), 7.6 parts of xylene diisocyanate-trimethylolpropane adduct (a 75% ethyl acetate solution, Takenate D110N, manufactured by Takeda Chemical Industries, Ltd.) was added to the above-obtained solution and stirred homogeneously. Separately, 2.0 parts of a 10 wt % aqueous solution of sodium dodecylsulfonate was added to 64 parts of a 6 wt % aqueous gelatin solution (MGP-9066, manufactured by Nippi Gelatin Industry Co., Ltd.) and emulsified with a homogenizer.

To the obtained emulsified solution was added 20 parts of water to make the solution homogeneous, and the temperature of the solution was raised to 40° C. with stirring and capsulation reaction was performed for 3 hours. The temperature of the solution was then lowered to 35° C., and 6.5 parts of ion exchange resin Amberlite IRA68 (manufactured by Organo Co., Ltd.), and 13 parts of Amberlite IRC50 (manufactured by Organo Co., Ltd.) were added to the above solution and the content was stirred for 1 hour. Then, the ion exchange resins were filtered to obtain the objective capsule solution. The average particle size of the capsules was 0.64 μm, which was designated microencapsulated particle 1.

Hydrophobitization Precursor I: Reactive Composite Particle 1 having Hetero Coagulation Surface Layer Glycidyl methacrylate (2.0 g), 13.0 g of methyl methacrylate and 200 ml of an aqueous solution containing polyoxyethylene phenol ether (concentration: $8\times10^{-3}$ mol/liter) were mixed at 250 rpm, and the inside of the system was replaced with nitrogen gas. After the temperature of this solution was increased to 25° C., 10 ml of an aqueous solution of cerium (IV) ammonium salt (concentration: $0.984\times10^{-3}$ mol/liter) was added to the above solution. At this time, the pH was adjusted to 1.3 to 1.4 with an aqueous solution of ammonium nitrate (concentration: $58.5\times10^{-3}$ mol/liter). The solution was then stirred for 8 hours. The thus-obtained solution had the concentration of the solids content of 9.5% and an average particle size of 0.4 μm.

Snowtex C (manufactured by Nissan Chemical Industries, Ltd.) (30 g) was added to this resin particle dispersion solution. Thus hydrophobitization precursor I (reactive composite particles 1) having a particle size of 0.5 μm and having hetero-coagulated hydrophilic surface layer comprising resin core and silica layer shell, where silica sol fine particles were hetero-coagulated on the surfaces of resin particles, was produced.

Hydrophobitization Precursor J: Reactive Composite Particle 2 having Hetero Coagulation Surface Layer Seven point five (7.5) grams of allyl methacrylate and 7.5 g of styrene were polymerized in the same manner as above. The thus-obtained solution had the concentration of the solids content of 9.5% and an average particle size of 0.4 μm.

Snowtex C (manufactured by Nissan Chemical Industries, Ltd.) (30 g) was added to this resin particle dispersion solution. Thus hydrophobitization precursor J (reactive composite particles 2) having a particle size of 0.45 μm and having hetero-coagulated hydrophilic surface layer comprising resin core and silica layer shell, where silica sol fine particles were hetero-coagulated on the surfaces of resin particles, was produced.

Hydrophobitization Precursor K: Reactive Microencapsulated Particle 1

As the oil phase components, 40 g of xylylene diisocyanate, 10 g of trimethylolpropane diacrylate, 10 g of a copolymer of allyl methacrylate and butyl methacrylate (7/3 in molar ratio), and 0.1 g of Pionin A41C (manufactured by Takemoto Yushi Co., Ltd.) were dissolved in 60 g of ethyl acrylate. As the water phase component, 120 g of a 4% aqueous solution of PVA205 (manufactured by Kuraray Co., Ltd.) was prepared. The oil phase components and the water phase component were emulsified at 10,000 rpm with a homogenizer. Thereafter, 40 g of water was added thereto and the emulsion was stirred for 30 minutes at room temperature and further for 3 hours at 40° C. The thus-obtained microencapsulated solution had the concentration of the solids content of 20% and an average particle size of 0.5 μm.

Snowtex C (manufactured by Nissan Chemical Industries, Ltd.) (30 g) was added to this resin particle dispersion solution. Thus hydrophobitization precursor K (reactive microencapsulated particle 1) having a particle size of 0.6 μm and having hetero-coagulated hydrophilic surface layer comprising resin core and silica layer shell, where silica sol fine particles were hetero-coagulated on the surfaces of resin particles, was produced.

Hydrophobic Resin Particle Dispersion 1 for Reference Example

Into a three neck flask were added 80 g of styrene, 10 g of divinylbenzene, 10 g of Macromonomer AA-6 (dispersant, manufactured by Toa Gosei Co., Ltd.), and 400 g of MEK, and the temperature was raised to 75° C. while introducing nitrogen. Thereafter, the content of the flask was stirred for about 30 minutes, then 2 g of azoisobutyronitrile was added thereto and dispersion polymerization was conducted at 75° C. for 6 hours, thus resin particles having an average particle size of 0.2 μm were obtained.

Hydrophilic Resin Particle Dispersion 1 for Reference Example 2

The dispersion of polyvinyl pyrrolidone dispersion polymerized particles (an average particle size: 0.2 μm) were used.

TABLE II-2

| Example No. | Hydrophobitization Precursor | Contact Angle with Water Droplet of Non-radiated Area | Contact Angle with Water Droplet of Irradiated Area |
|---|---|---|---|
| Example II-14 | B | Extended wetting | 102° |
| Example II-15 | C | Extended wetting | 98° |
| Example II-16 | D | Extended wetting | 106° |
| Example II-17 | E | Extended wetting | 108° |
| Example II-18 | F | Extended wetting | 111° |
| Example II-19 | G | Extended wetting | 104° |
| Example II-20 | H | Extended wetting | 105° |
| Example II-21 | I | Extended wetting | 109° |
| Example II-22 | J | Extended wetting | 102° |
| Example II-23 | K | Extended wetting | 108° |
| Reference Example 1 | Hydrophobic resin particle dispersion 1 | 20° | 110° |
| Reference Example 2 | Hydrophilic resin particle dispersion 1 | 15° | 103° |

Examples II-24 to II-26

A printing plate was prepared in the same manner as in Example II-3 except that the sol/gel adjusting solution in the coating solution for the image-recording layer was prepared by replacing tetraethoxysilane with each silane coupling agent and additive shown in Table II-3 below.

The contact angle with water droplet of the surface of each of the thus-prepared printing plates showed extended wetting, i.e., the hydrophilicity of the surface was remarkably high.

The contact angle with water droplet of the surface of the imagewise irradiated area of each of the above-obtained printing plates formed by heat coagulation was as shown in Table II-3. The inking was uniform, the background of the non-image area was not stained, and good printed matters could be obtained. Ten thousand (10,000) sheets of printed matters were further printed and high quality printed matters having no printing staining were obtained.

TABLE III-3

| Example No. | Silane Coupling Agent | Additive | Contact Angle with Water Droplet of Irradiated Area |
|---|---|---|---|
| Example II-24 | Aminopropylsilane triol | Nitric acid | 108° |
| Example II-25 | Aminopropyltrimethoxysilane | Nitric acid | 110° |
| Example II-26 | Mercaptopropyltrimethoxysilane | Silver nitrate | 115° |

The lithographic printing plate precursor according to the present invention, wherein an exothermic layer is provided as the lower layer of the photosensitive layer, and light-to-heat convertible metallic fine particles which change to hydrophobic with the conversion of light to heat and a hydrophobitization precursor are contained, is capable of plate-making by heat mode image-recording, capable of mounting on a printing machine for plate-making with ease requiring no development, and also capable of image-recording by scanning exposure. The lithographic printing plate precursor of the present invention is excellent in press life and inking property, and is resistant to printing staining. In particular, according to scanning system image exposure by laser beams, plate-making is easily performed with high sensitivity and sufficiently wide latitude of exposure light amount, and the resulting printing plate is excellent in the discriminability of an image area and a non-image area, press life and inking property.

While the invention has been described in detail and with reference to specific examples thereof, it will be apparent to one skilled in the art that various changes and modifications can be made therein without departing from the spirit and scope thereof.

What is claimed is:

1. A lithographic printing plate precursor which comprises a support having provided thereon a layer containing a light-to-heat converting agent as a lower layer and a hydrophilic photosensitive layer containing light-to-heat convertible metallic fine particles having a particle size of 3 to 8 nm which change to hydrophobic with the conversion of light to heat as an upper layer wherein the metallic fine particles contained in the hydrophilic photosensitive layer are single or alloy metallic fine particles selected from the metallic elements belonging to group VIII or group I-B of the Periodic Table.

2. The lithographic printing plate precursor as claimed in claim 1, wherein a water-soluble protective layer is further provided on the hydrophilic photosensitive layer.

3. A lithographic printing plate precursor which comprises a support having provided thereon a layer containing a light-to-heat converting agent as a lower layer and a hydrophilic photosensitive layer containing light-to-heat convertible metallic fine particles having a particle size of 3 to 8 nm which change to hydrophobic with the conversion of light to heat as an upper layer wherein an organic sulfur compound having at least one hydrophilic group and at least one metal-adsorbing group is adsorbed onto the surfaces of the metallic fine particles contained in the hydrophilic photosensitive layer.

4. The lithographic printing plate precursor as claimed in claim 3, wherein a water-soluble protective layer is further provided on the hydrophilic photosensitive layer.

5. A lithographic printing plate precursor which comprises a support having provided thereon a layer containing a light-to-heat converting agent as a lower layer and a hydrophilic photosensitive layer containing light-to-heat convertible metallic fine particles having a particle size of 3 to 8 nm which change to hydrophobic with the conversion of light to heat and a hydrophobitization precursor having a hydrophilic surface as an upper layer wherein the metallic fine particles contained in the hydrophilic photosensitive layer are single or alloy metallic fine particles selected from the metallic elements belonging to group VIII or group I-B of the Periodic Table.

6. The lithographic printing plate precursor as claimed in claim 5, wherein the hydrophobitization precursor having a hydrophilic surface comprises composite particles containing a hydrophobic substance in core parts and having hydrophilic property in surface parts.

7. The lithographic printing plate precursor as claimed in claim 5, wherein a water-soluble protective layer is further provided on the hydrophilic photosensitive layer.

8. A lithographic printing plate precursor which comprises a support having provided thereon a layer containing a light-to-heat converting agent as a lower layer and a hydrophilic photosensitive layer containing light-to-heat convertible metallic fine particles having a particle size of 3 to 8 nm which change to hydrophobic with the conversion of light to heat and a hydrophobitization precursor having a hydrophilic surface as an upper layer wherein an organic sulfur compound having at least one hydrophilic group and at least one metal-adsorbing group is adsorbed onto the surfaces of the metallic fine particles contained in the hydrophilic photosensitive layer.

9. The lithographic printing plate precursor as claimed in claim 8, wherein the hydrophobitization precursor having a hydrophilic surface comprises composite particles containing a hydrophobic substance in core parts and having hydrophilic property in surface parts.

10. The lithographic printing plate precursor as claimed in claim 8, wherein a water-soluble protective layer is further provided on the hydrophilic photosensitive layer.

11. A lithographic printing plate precursor which comprises a support having provided thereon a layer containing a light-to-heat converting agent as a lower layer and a hydrophilic photosensitive layer containing light-to-heat convertible metallic fine particles having a particle size of 3 to 8 nm which change to hydrophobic with the conversion of light to heat as an upper layer wherein the light-to-heat convertible metallic fine particles are heat-fused to form a hydrophobic metal thin film.

12. The lithographic printing plate precursor as claimed in claim 11, wherein a water-soluble protective layer is further provided on the hydrophilic photosensitive layer.

13. A lithographic printing plate precursor which comprises a support having provided thereon a layer containing a light-to-heat converting agent as a lower layer and a hydrophilic photosensitive layer containing light-to-heat convertible metallic fine particles having a particle size of 3 to 8 nm which change to hydrophobic with the conversion of light to heat and a hydrophobitization precursor having a hydrophilic surface as an upper layer wherein the light-to-heat convertible metallic fine particles are heat-fused to form a hydrophobic metal thin film.

14. The lithographic printing plate precursor as claimed in claim 13, wherein the hydrophobitization precursor having a hydrophilic surface comprises composite particles containing a hydrophobic substance in core parts and having hydrophilic property in surface parts.

15. The lithographic printing plate precursor as claimed in claim 13, wherein a water-soluble protective layer is further provided on the hydrophilic photosensitive layer.

* * * * *